(12) United States Patent
Park et al.

(10) Patent No.: US 9,947,589 B1
(45) Date of Patent: Apr. 17, 2018

(54) METHODS OF FORMING A GATE CONTACT FOR A TRANSISTOR ABOVE AN ACTIVE REGION AND THE RESULTING DEVICE

(71) Applicant: GLOBALFOUNDRIES Inc., Grand Cayman (KY)

(72) Inventors: Chanro Park, Clifton Park, NY (US); Ruilong Xie, Niskayuna, NY (US); Lars W. Liebmann, Halfmoon, NY (US); Andre P. Labonte, Mechanicville, NY (US); Nigel G. Cave, Saratoga Springs, NY (US); Mark V. Raymond, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/600,874

(22) Filed: May 22, 2017

(51) Int. Cl.
*H01L 21/8234* (2006.01)
*H01L 21/768* (2006.01)
*H01L 21/3213* (2006.01)
*H01L 23/535* (2006.01)
*H01L 29/66* (2006.01)
(Continued)

(52) U.S. Cl.
CPC ............ *H01L 21/823437* (2013.01); *H01L 21/32139* (2013.01); *H01L 21/76805* (2013.01); *H01L 21/76892* (2013.01); *H01L 21/76895* (2013.01); *H01L 21/823468* (2013.01); *H01L 21/823864* (2013.01); *H01L 23/535* (2013.01); *H01L 29/41783* (2013.01); *H01L 29/6656* (2013.01); *H01L 29/66553* (2013.01); *H01L 21/823462* (2013.01); *H01L 21/823828* (2013.01); *H01L 21/823857* (2013.01); *H01L 29/66545* (2013.01)

(58) Field of Classification Search
CPC ......... H01L 21/8232; H01L 21/823437; H01L 21/823462; H01L 21/823468; H01L 21/823828; H01L 21/823857; H01L 21/823864; H01L 29/41783; H01L 29/66545; H01L 29/66553; H01L 29/6656
See application file for complete search history.

(56) References Cited

U.S. PATENT DOCUMENTS

2011/0298017 A1* 12/2011 Jain .................. H01L 21/76897
257/288
2013/0248950 A1* 9/2013 Kang .................... H01L 29/78
257/288
(Continued)

*Primary Examiner* — Eduardo A Rodela
(74) *Attorney, Agent, or Firm* — Amerson Law Firm, PLLC

(57) ABSTRACT

A transistor is formed above an active region. The transistor includes a gate structure, a first gate cap layer and a first sidewall spacer positioned adjacent sidewalls of the gate structure. Source/drain contacts are formed adjacent the first sidewall spacer. The first gate cap layer and a portion of the first sidewall spacer are removed to define a gate contact cavity that exposes a portion of the gate structure and an upper portion of the SD contacts. A second spacer and a conductive gate plug are formed in the gate contact cavity. Upper portions of the SD contacts positioned adjacent the second spacer are removed to define a gate cap cavity. A second gate cap layer is formed in the gate cap cavity. An insulating layer is formed above the second gate cap layer. A first conductive structure is formed in the insulating layer conductively coupled to the gate structure.

19 Claims, 25 Drawing Sheets

(51) Int. Cl.
*H01L 29/417* (2006.01)
*H01L 21/8238* (2006.01)

(56) References Cited

U.S. PATENT DOCUMENTS

| | | | | |
|---|---|---|---|---|
| 2015/0364326 A1* | 12/2015 | Xie | ...................... | H01L 29/665 257/288 |
| 2015/0364378 A1* | 12/2015 | Xie | ................ | H01L 21/823437 257/368 |
| 2016/0104644 A1* | 4/2016 | Liu | .................. | H01L 21/82345 257/401 |
| 2016/0163601 A1* | 6/2016 | Xie | .................. | H01L 21/28088 257/392 |
| 2017/0194211 A1* | 7/2017 | Lai | ................ | H01L 21/823418 |

* cited by examiner

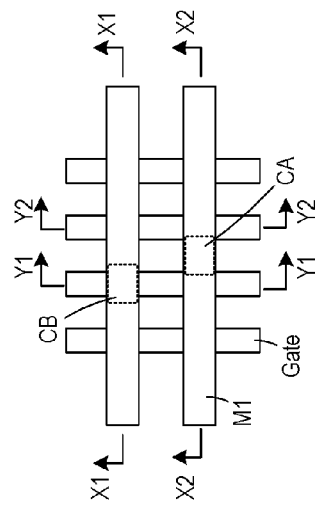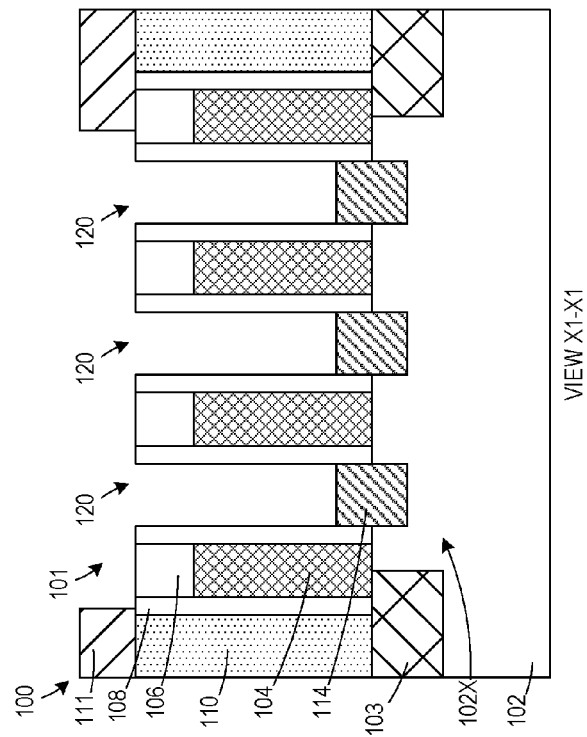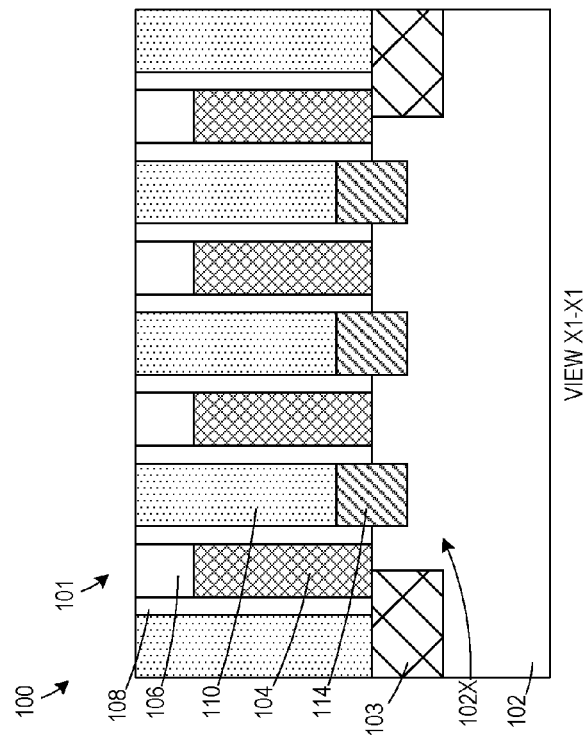

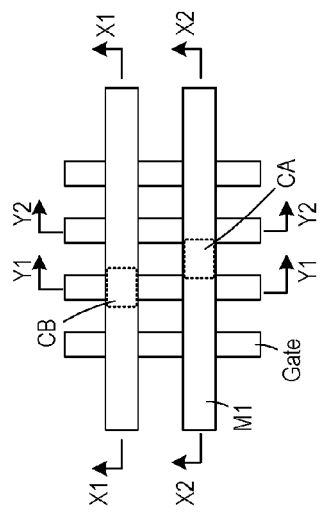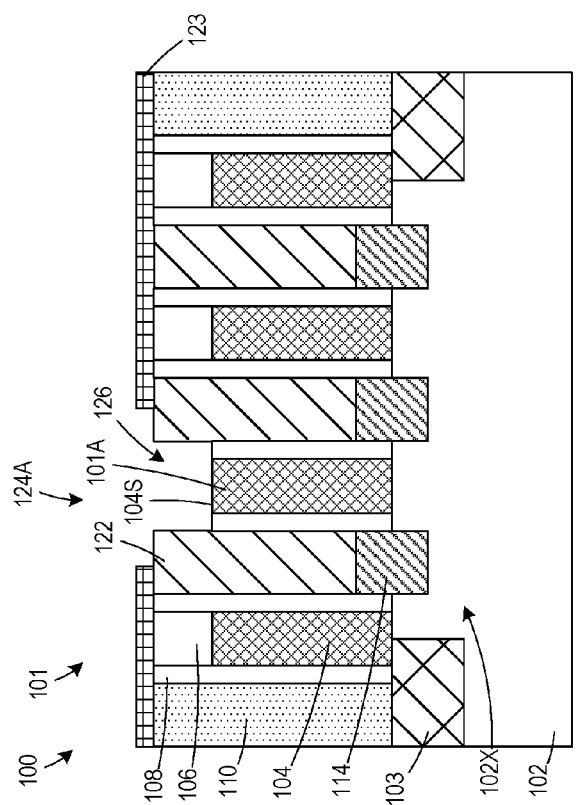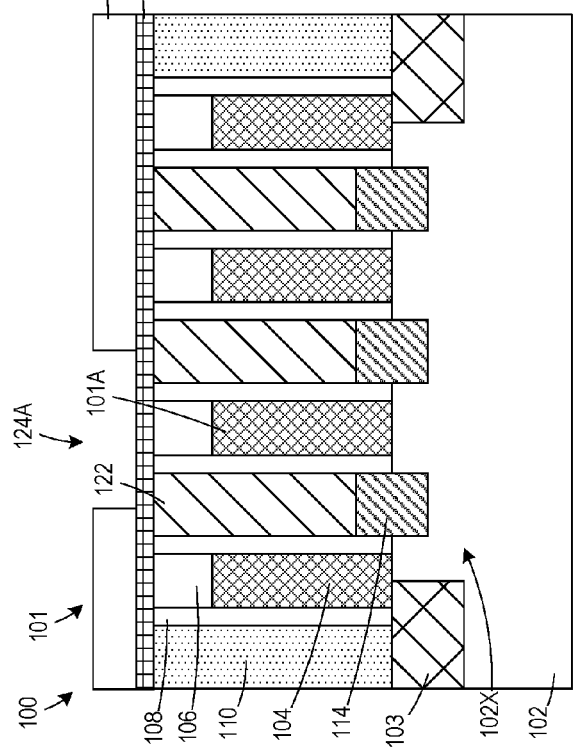
Figure 2C
Figure 2D

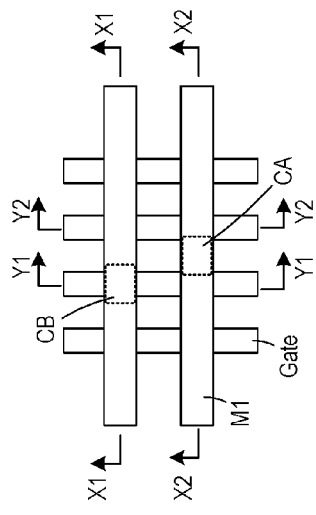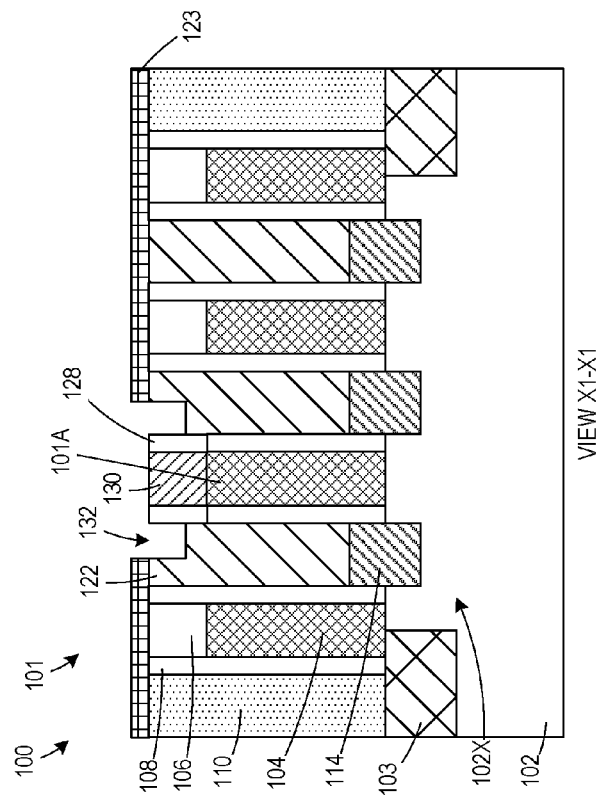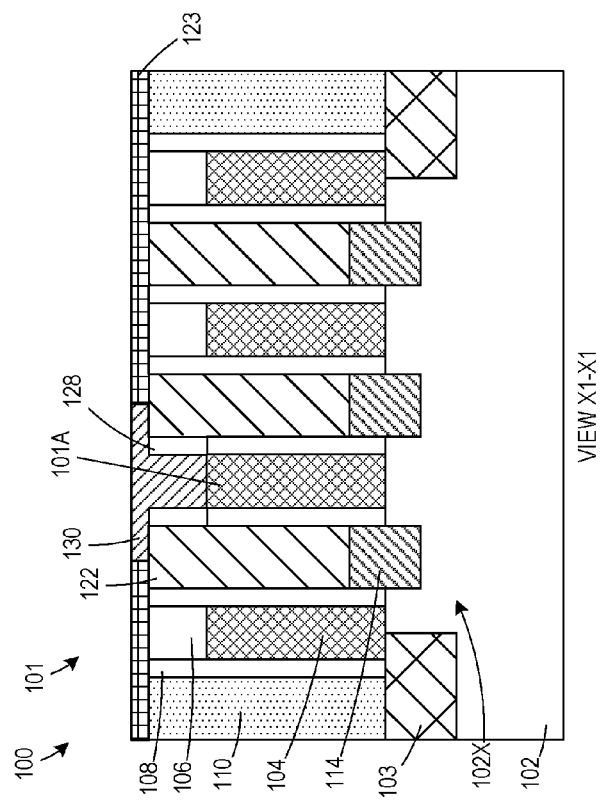
Figure 2F
Figure 2E

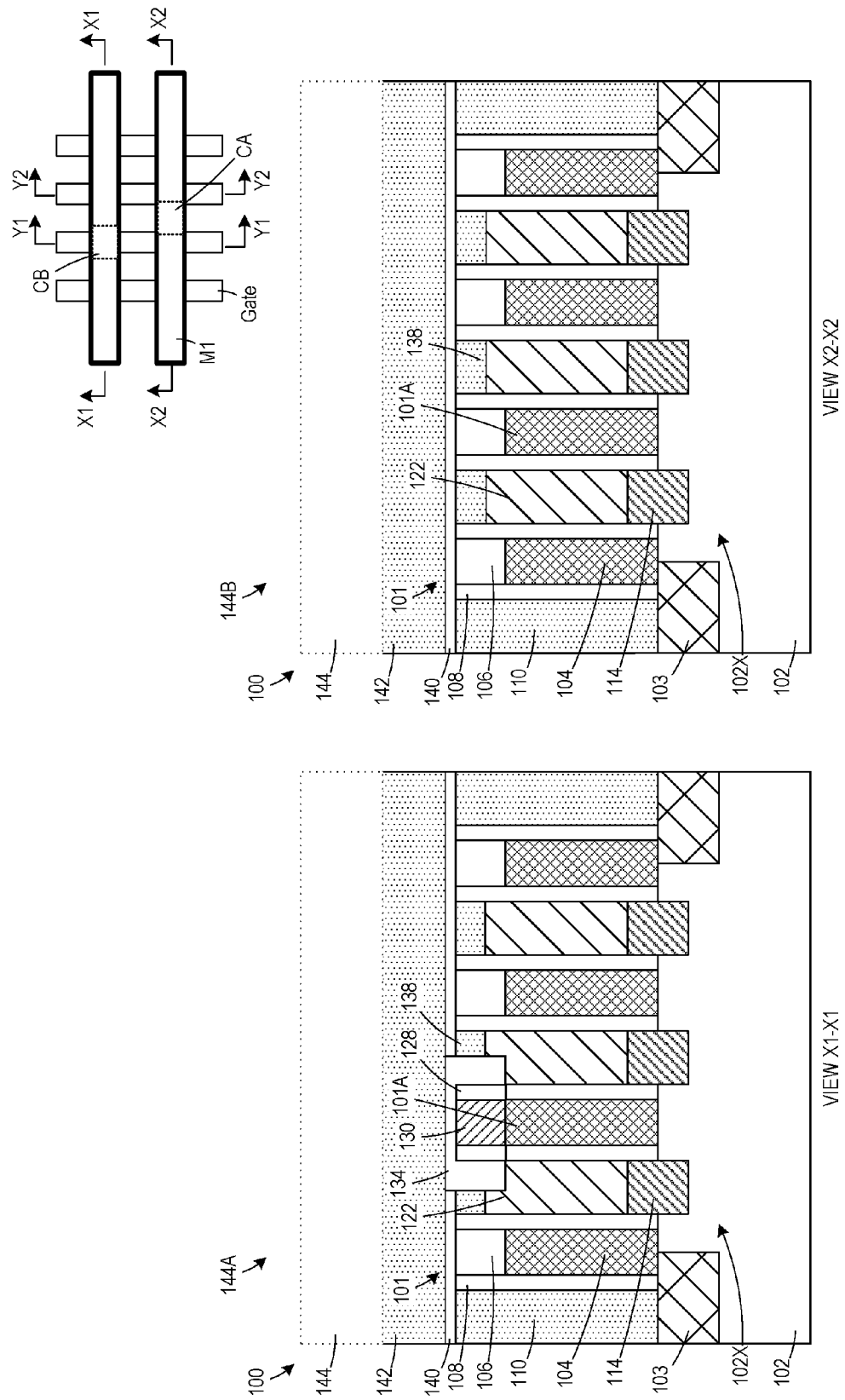
Figure 2J1

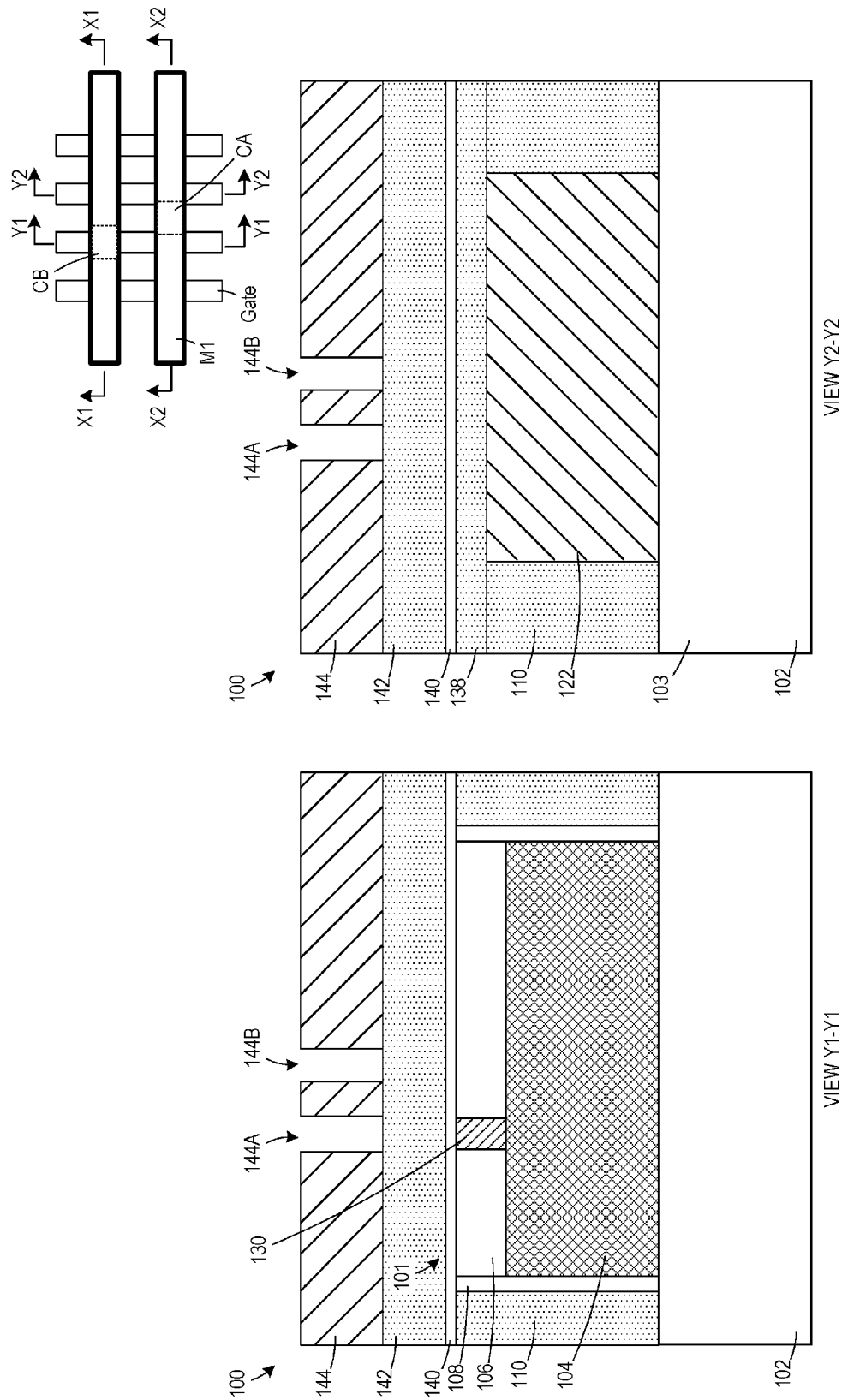
Figure 2J2

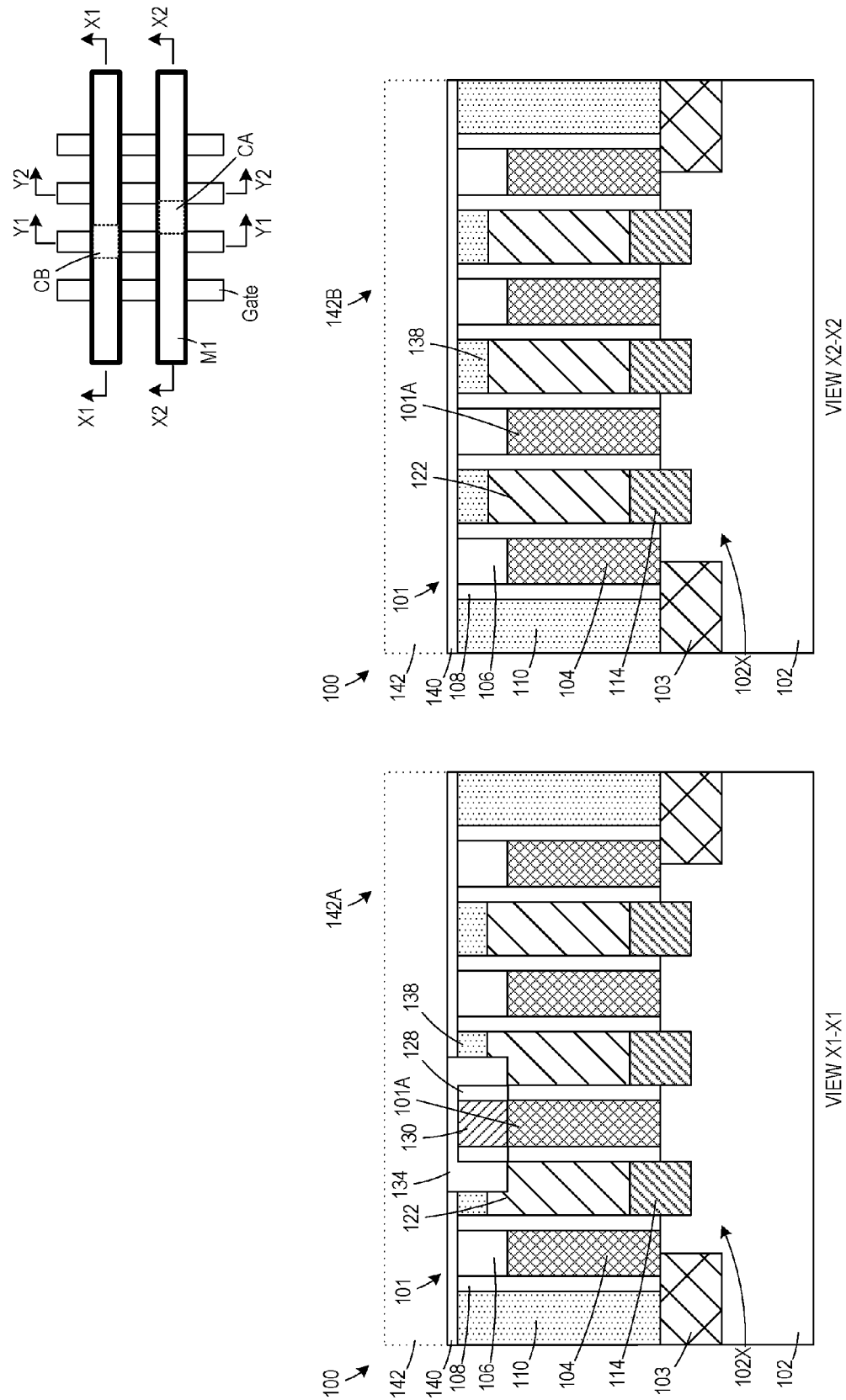
Figure 2K1

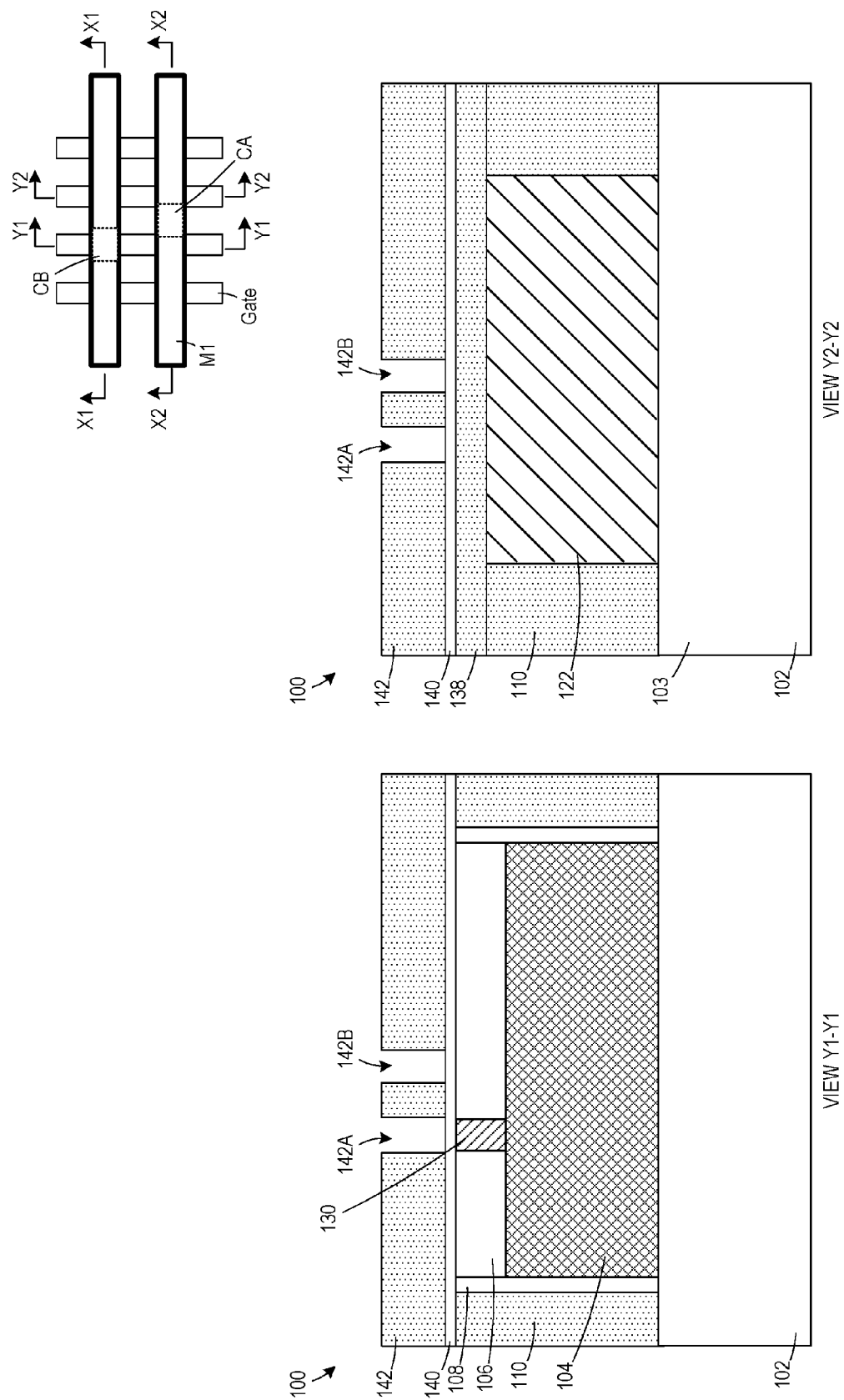
Figure 2K2

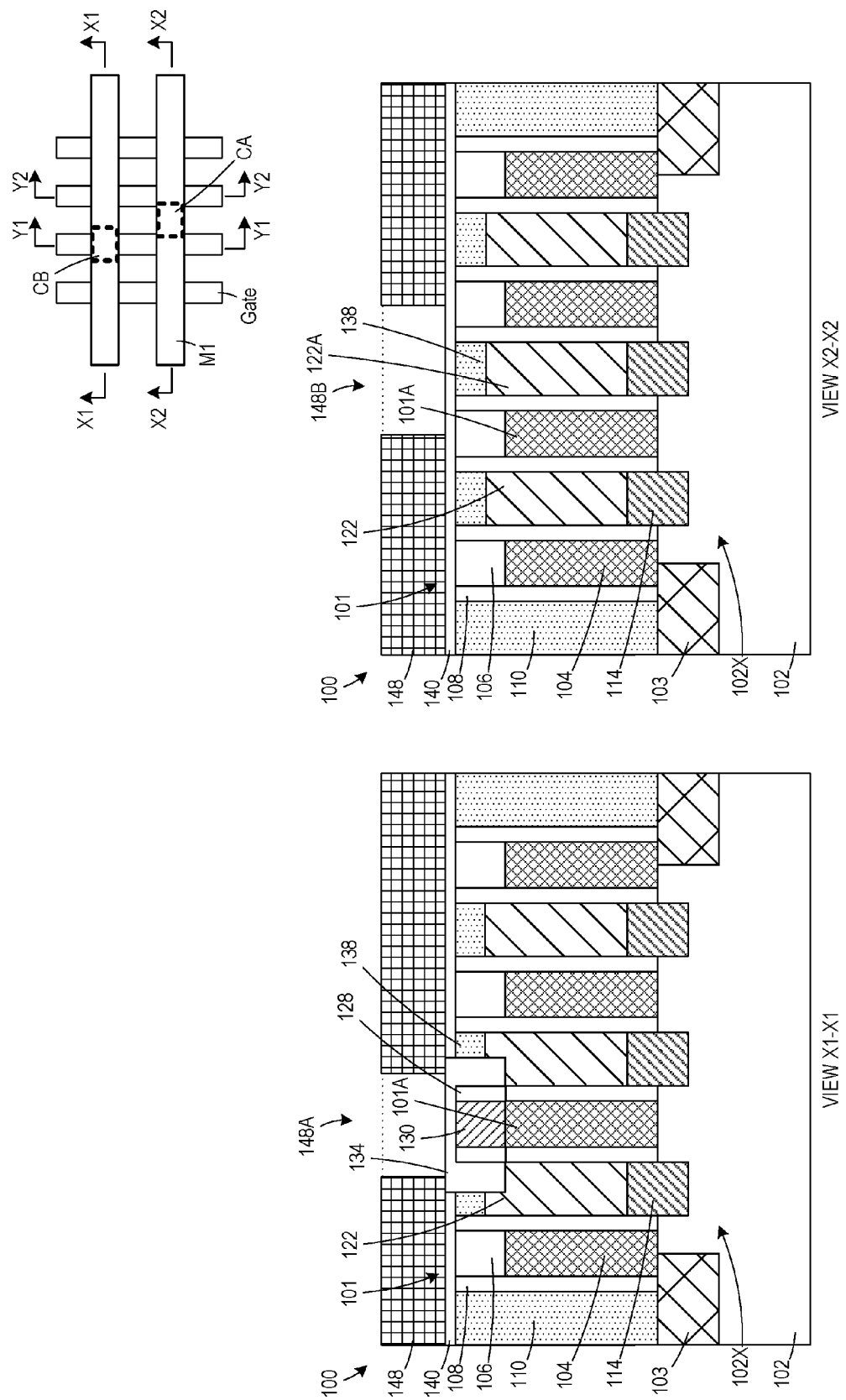
Figure 2L1

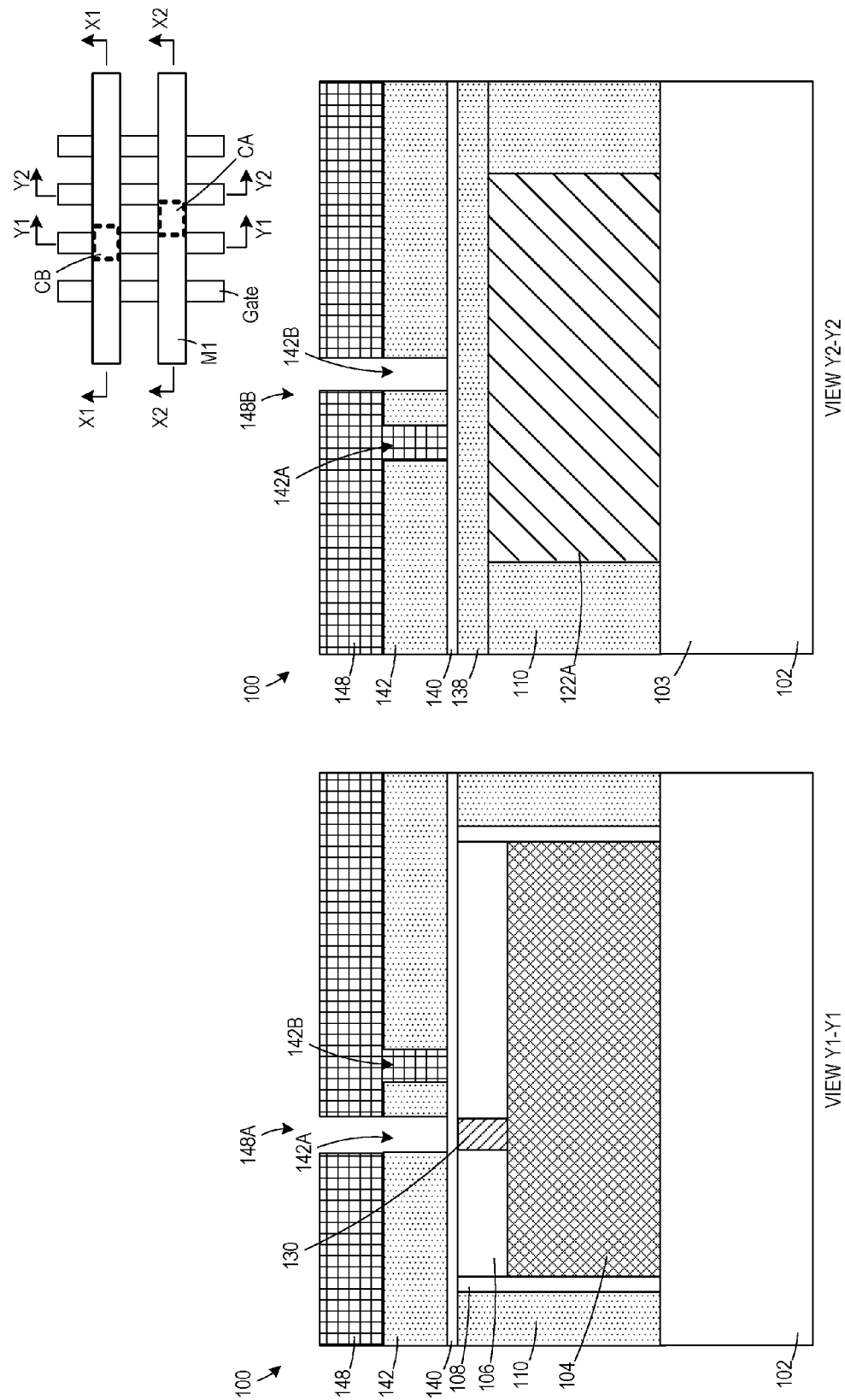
Figure 2L2

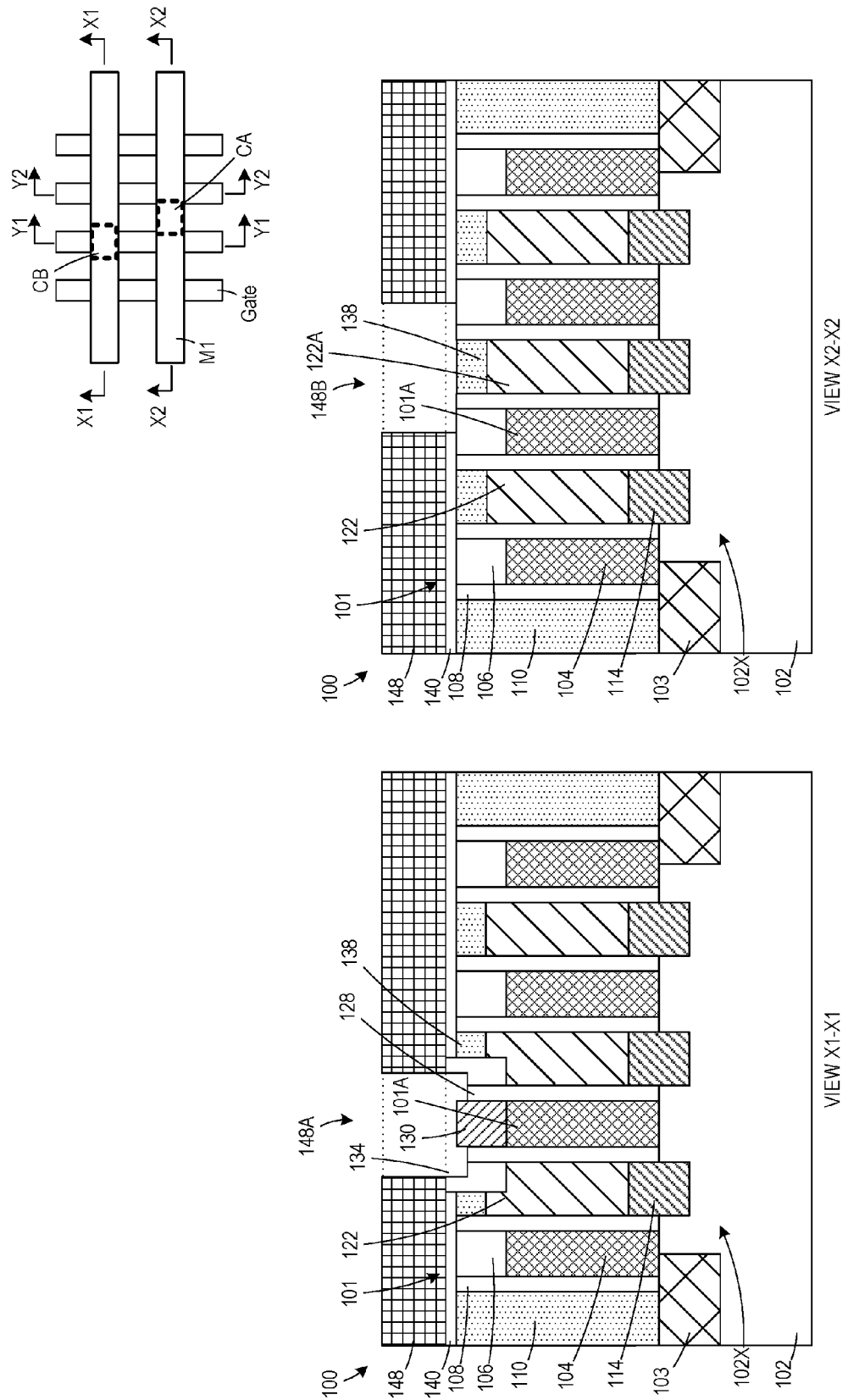
Figure 2M1

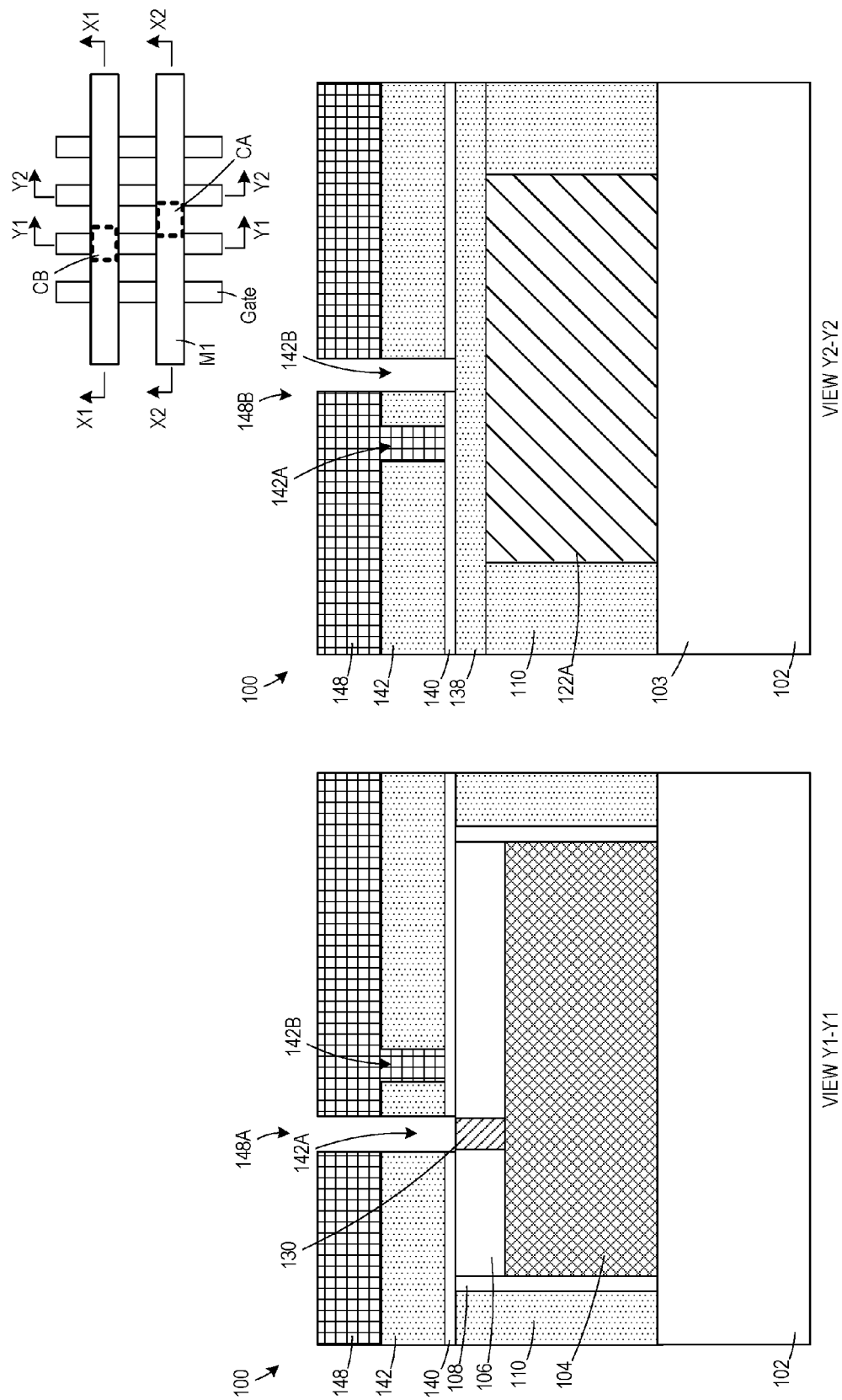
Figure 2M2

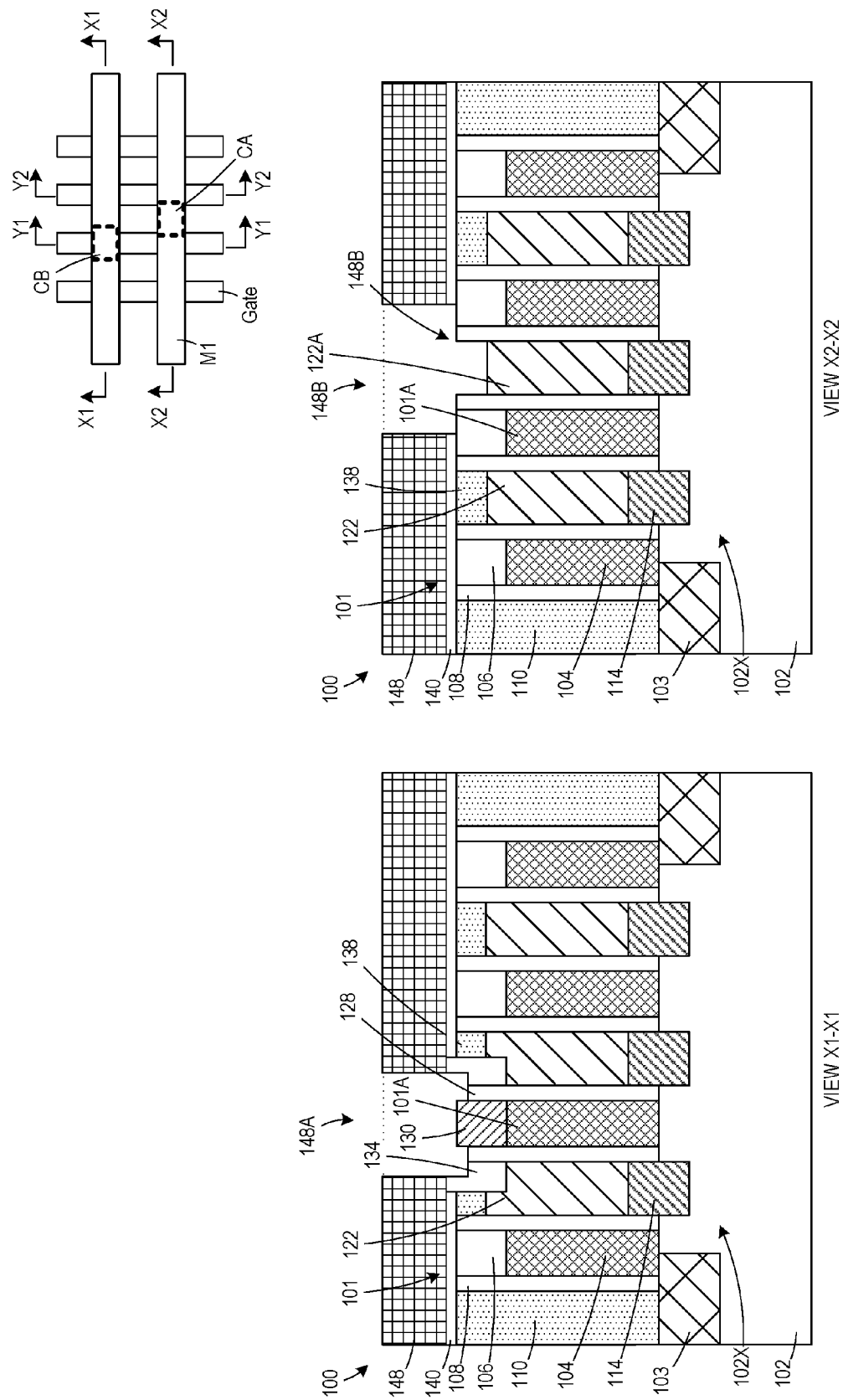
Figure 2N1

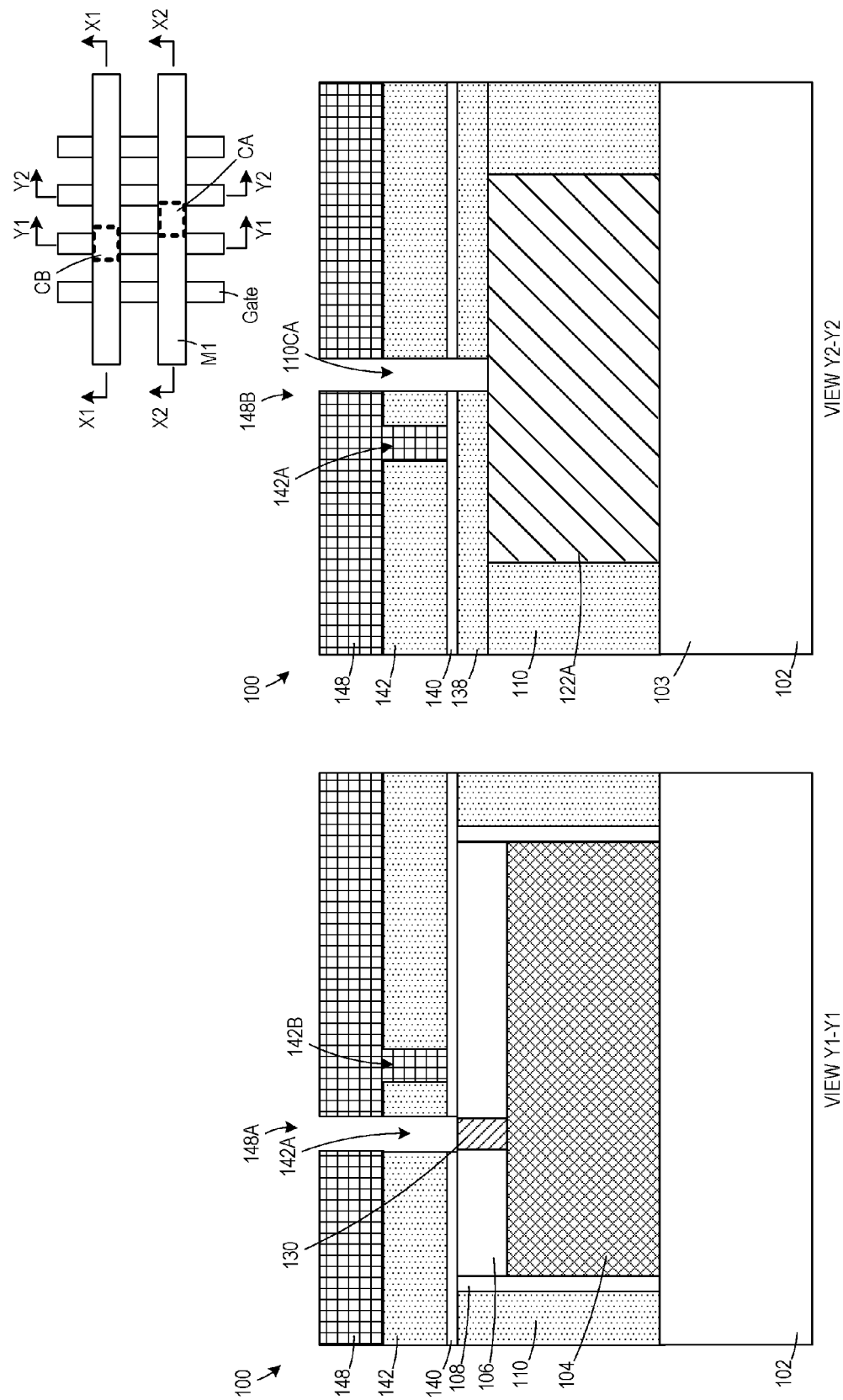
Figure 2N2

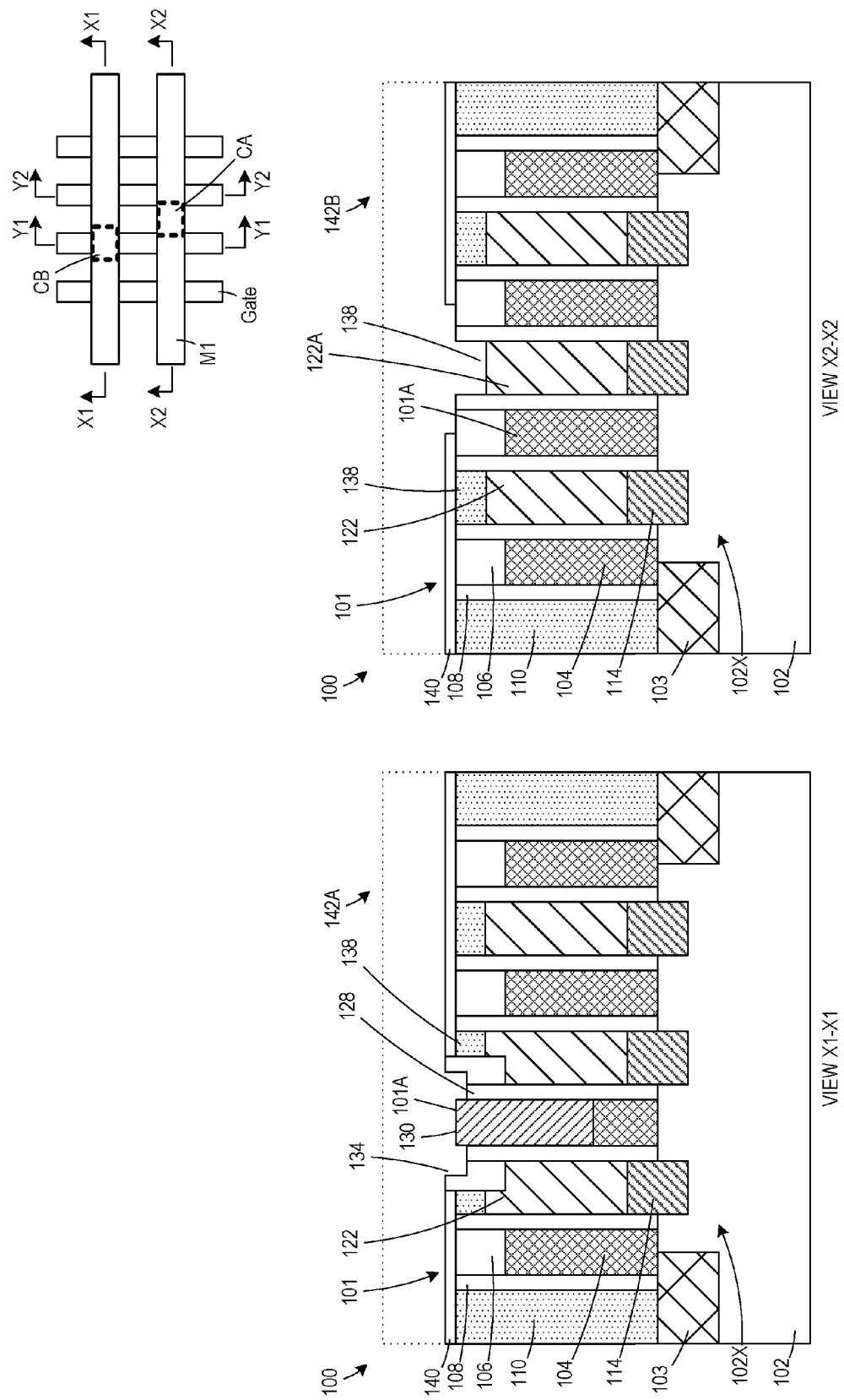
Figure 2O1

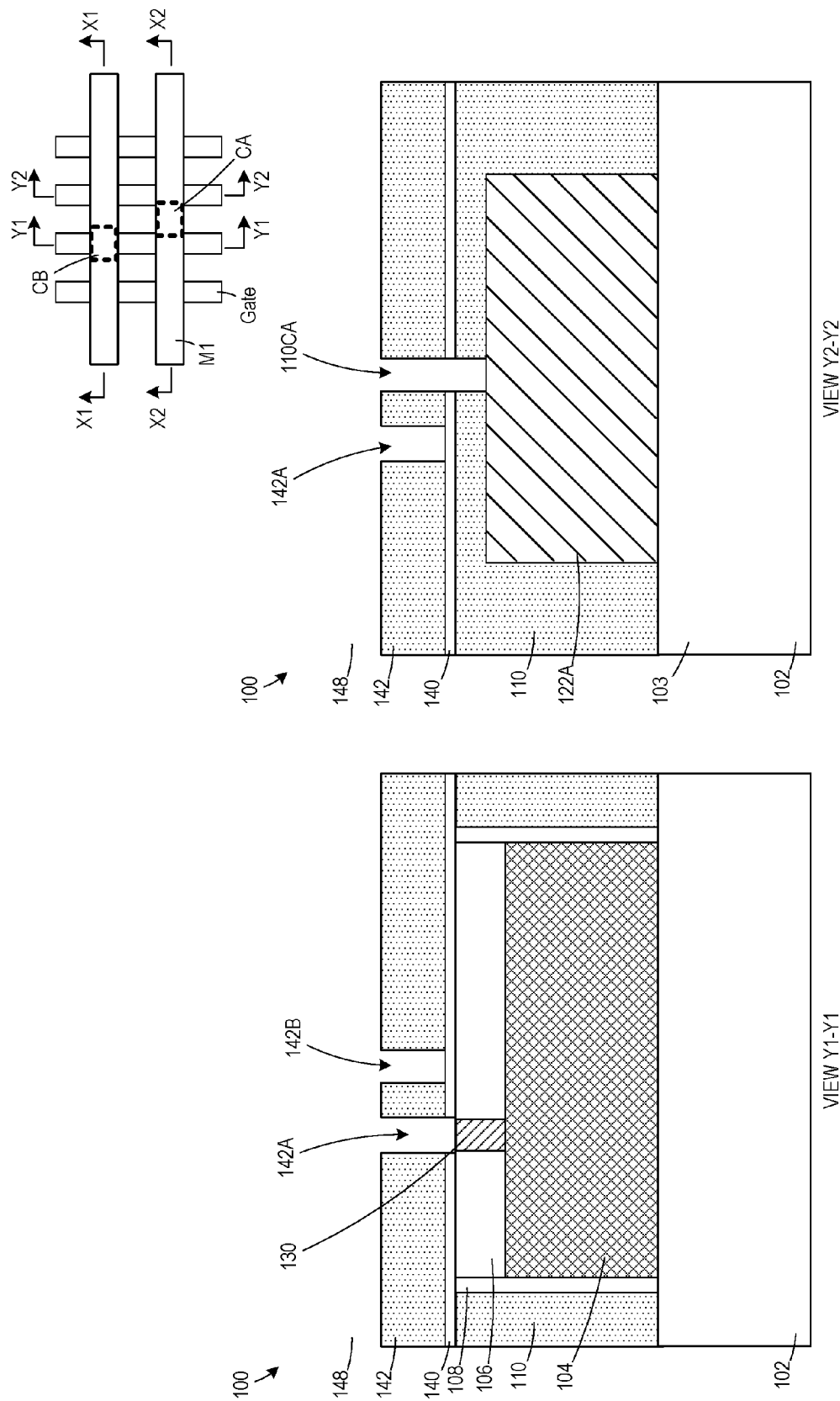
Figure 2O2

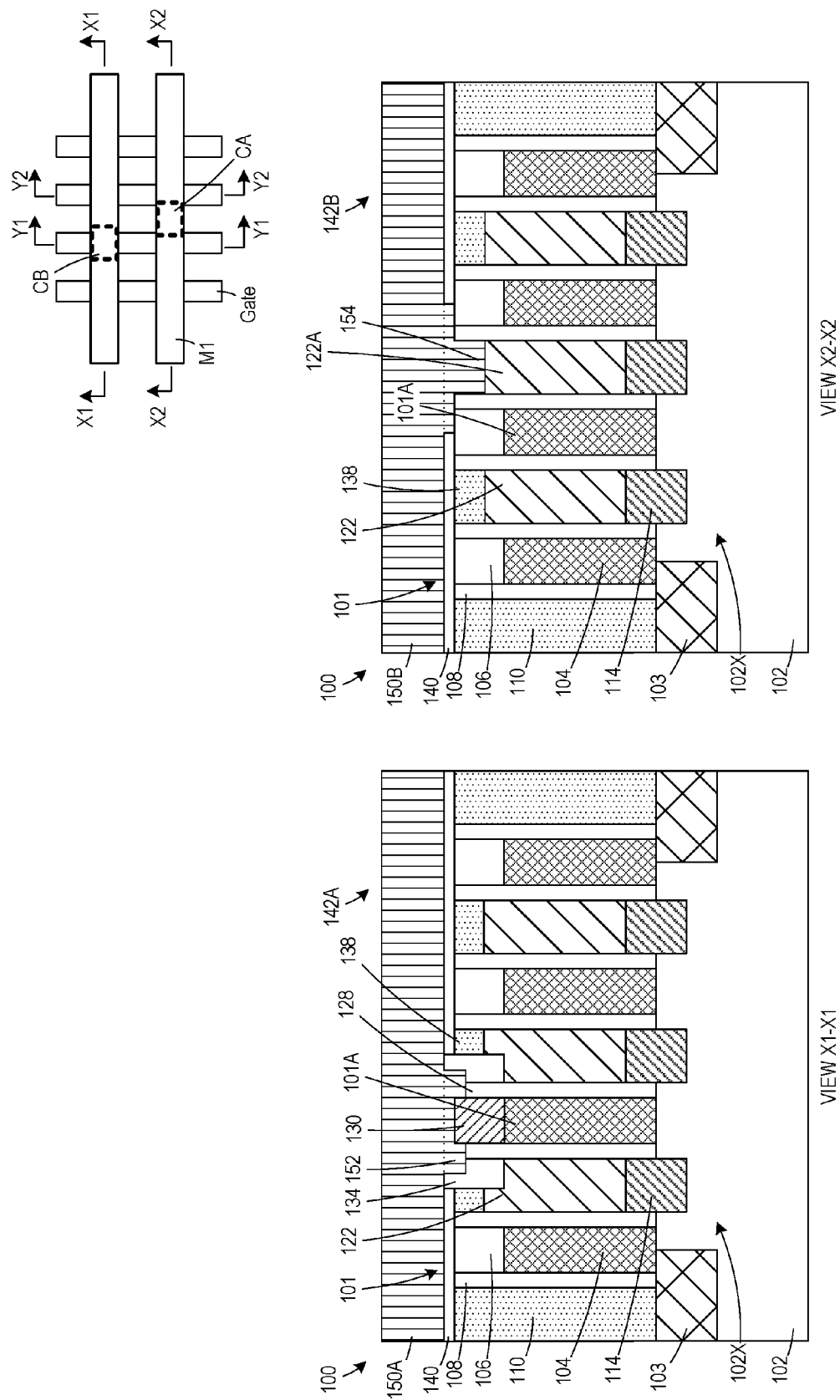
Figure 2P1

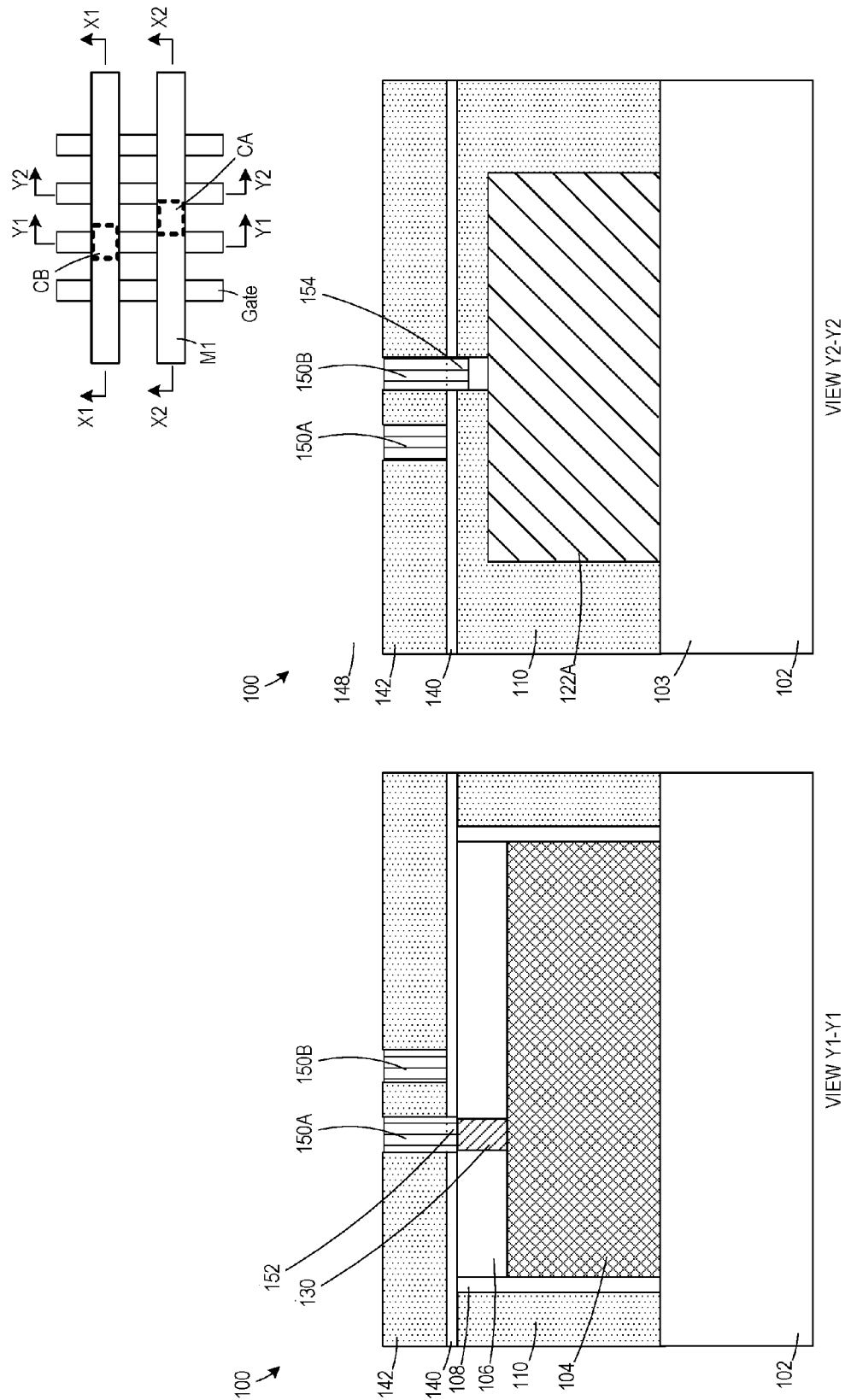
Figure 2P2

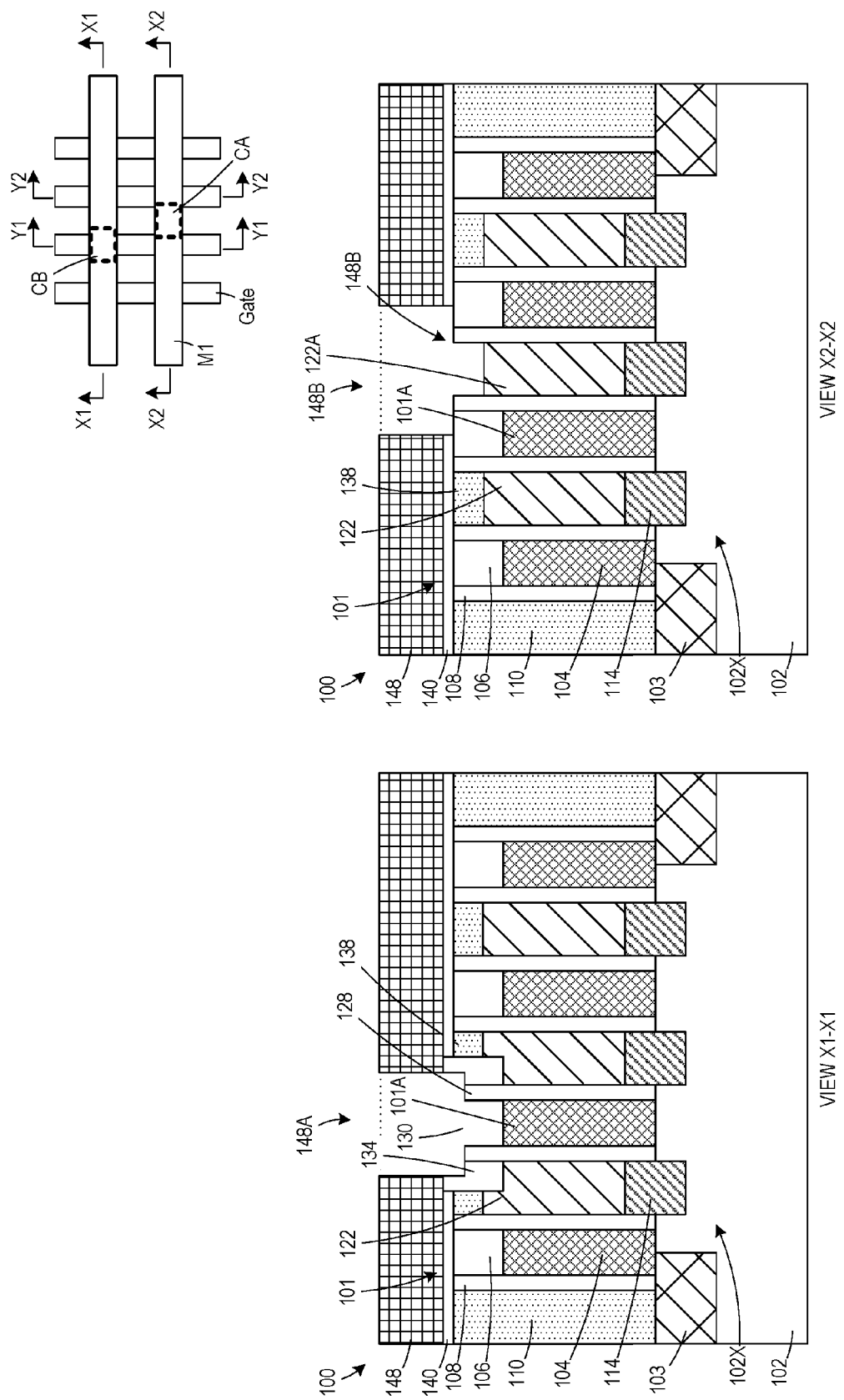
Figure 3A1

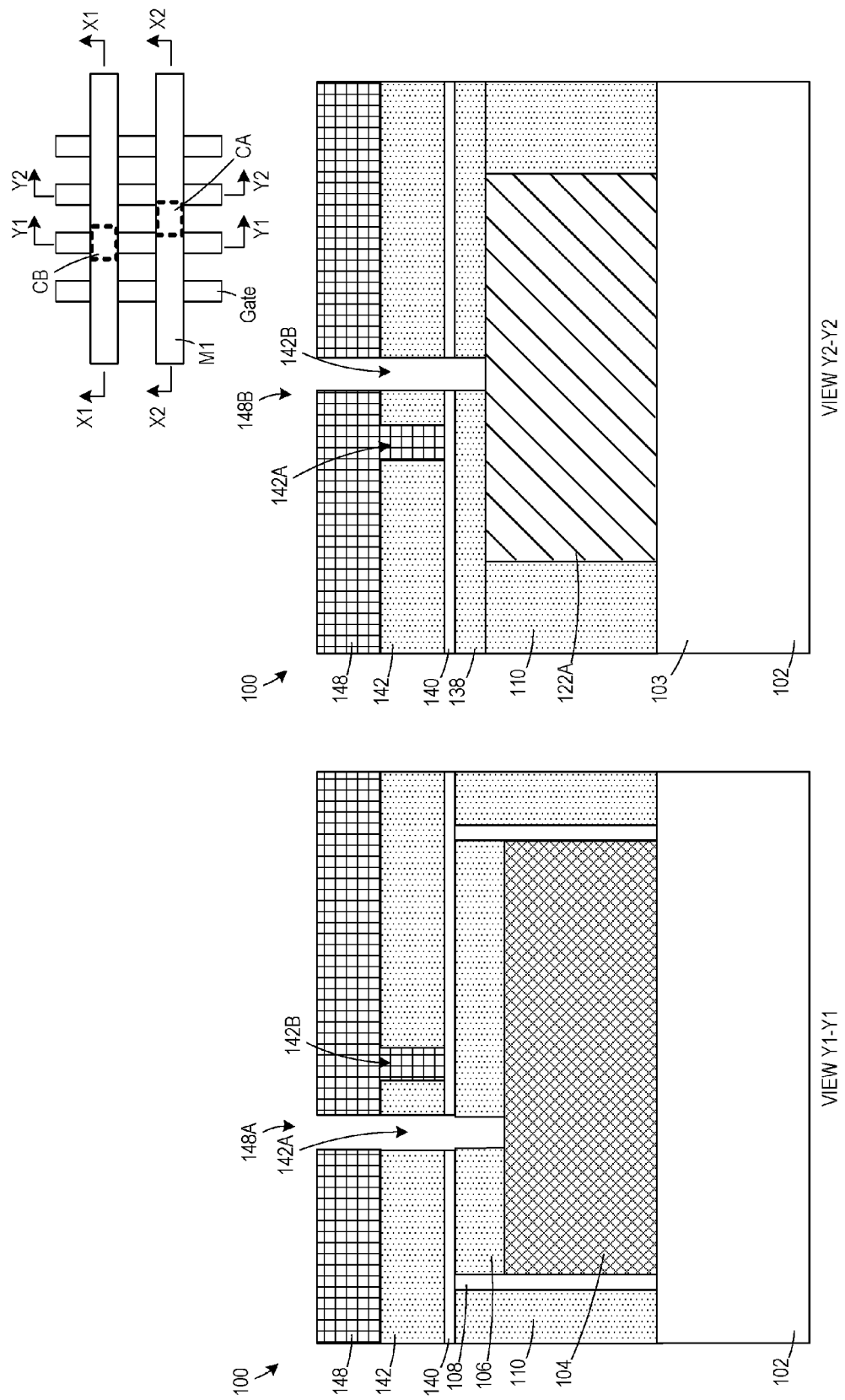
Figure 3A2

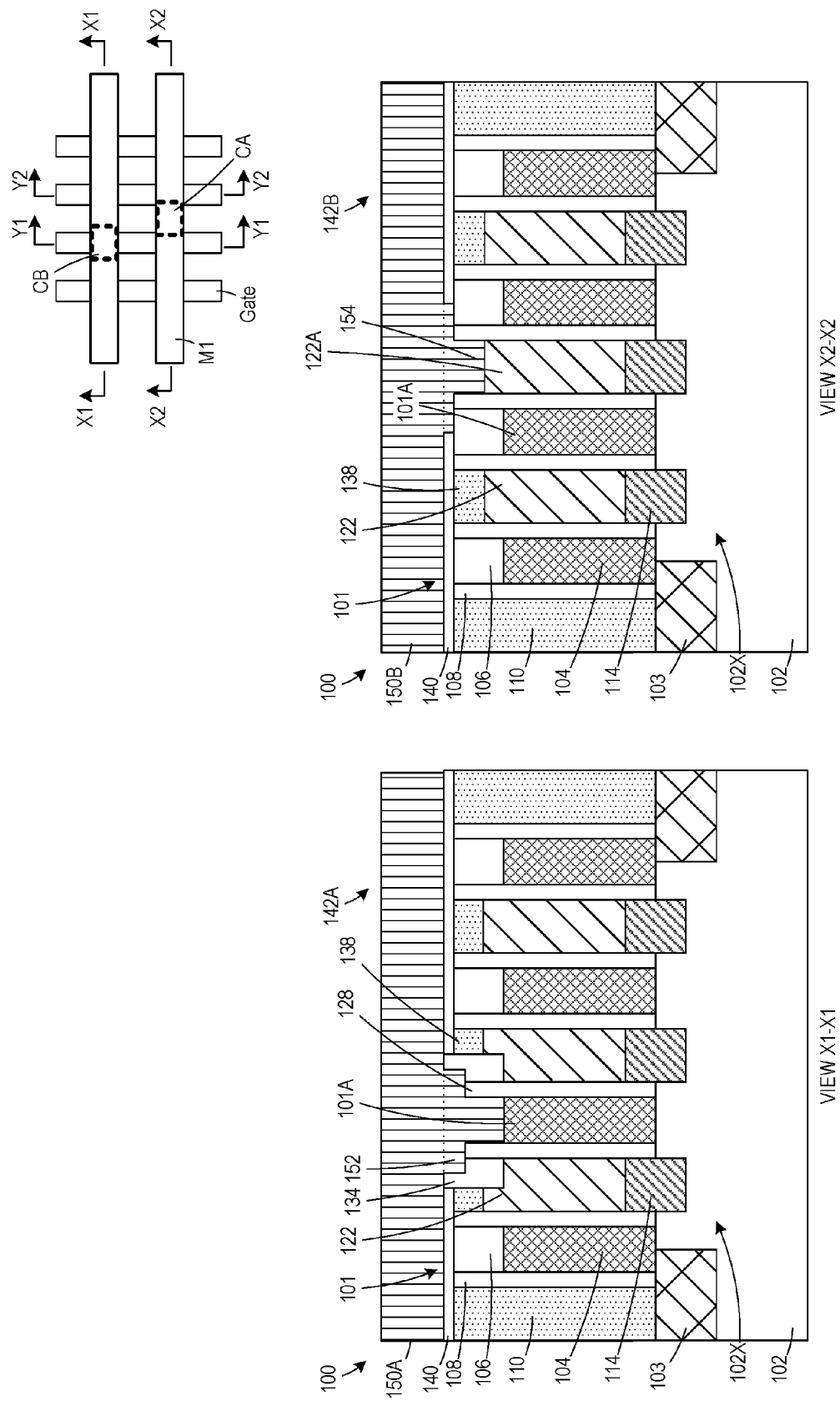
Figure 3B1

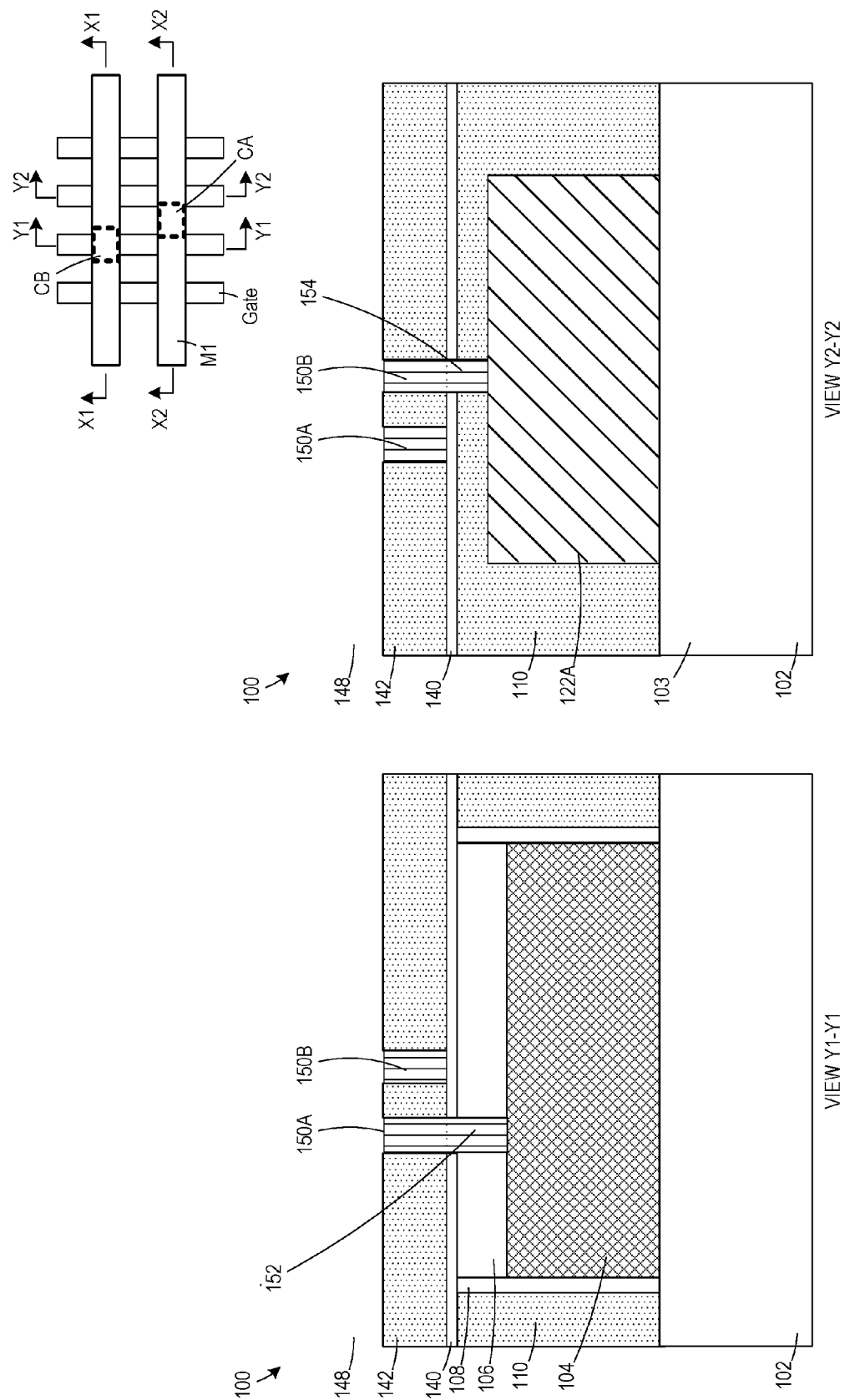
Figure 3B2

METHODS OF FORMING A GATE CONTACT FOR A TRANSISTOR ABOVE AN ACTIVE REGION AND THE RESULTING DEVICE

BACKGROUND OF THE INVENTION

1. Field of the Invention

The present disclosure generally relates to the fabrication of integrated circuits, and, more particularly, to various methods of forming a gate contact for a transistor above an active region and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16, which is sometimes referred to as a "CB contact" structure, that is formed so as to establish electrical contact to the gate structure of the transistor device. As shown in FIG. 1B, the CB gate contact 16 is typically positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation (dielectric) layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric materials, have been formed above the substrate 12. Other layers of material, such as contact etch stop layers and the like, are not depicted in the attached drawings. Also depicted are illustrative raised epitaxial source/drain (S/D) regions 32 and source/drain contact structures 34 which typically include a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in an interlayer dielectric material. In other applications (not shown in FIG. 1B), the CA contact structures 14 may also be a line-type feature that contacts underlying line-type features, e.g., the TS structure 36 that contacts the source/drain region 20 (the TS structure 36 is a line-type feature that typically extends across the entire active region on the source/drain region 20 in a direction that is parallel to that of the gate structure 22). The TS structures 36, CA contacts 14 and the CB contact 16 are all considered to be device-level contacts within the industry.

In one embodiment, the process flow of forming the TS structures 36, CA contacts 14 and CB contacts 16 may be as follows. After the first layer of insulating material 30A is deposited, TS openings are formed in the first layer of insulating material 30A that expose portions of underlying source/drain regions 20. Thereafter, a traditional metal silicide region is formed through the TS openings, followed by forming tungsten (not separately shown) on the metal silicide regions, and performing a chemical mechanical polishing (CMP) process down to the top of the gate cap layer 24. Then, the second layer of insulating material 30B is deposited and contact openings for the CA contacts 14 are formed in the second layer of insulating material 30B that expose portions of the underlying tungsten metallization above the source/drain regions 20. Next, while the opening for the CA contacts 14 is masked, the opening for the CB contact 16 is formed in the second layer of insulating material 30B and through the gate cap layer 24 so as to expose a portion of the gate electrode 22B. Typically, the CB contact 16 may be in the form of a round or square plug. Thereafter, the conductive CA contacts 14 and the conductive CB contact 16 are formed in their corresponding openings in the second layer of insulating material 30B by performing one or more common metal deposition and CMP process operations, using the second layer of insulating material 30B as a polish-stop layer to remove excess conductive material positioned outside of the contact openings. The CA contacts 14 and CB contact 16 typically contain a uniform body of metal, e.g., tungsten, and may also include one or more metallic barrier layers (not shown) positioned between the uniform body of metal and the layer of insulating material 30B. As noted above, the source/drain contact structures 34, the CA contacts 14 and the CB contact 16 are all considered to be device-level contacts within the industry.

With continuing reference to FIG. 1A, a portion of the multi-level metallization system for the IC product 10 is depicted. More specifically, FIG. 1A depicts an illustrative example of a so-called M1 metallization layer of the multi-level metallization system. The M1 metallization layer is formed in a layer of insulating material 38, e.g., a low-k insulating material. The M1 metallization layer typically includes a plurality of metal lines 42 that are routed as needed across the IC product 10. A plurality of conductive vias—so-called V0 vias 40—are formed so as to establish electrical connection between the M1 metallization layer and the device-level contacts—CA contacts 14 and the CB contact 16. The metallization lines 42 are typically formed by forming long continuous trenches in the layer of insulating material 38 across substantially the entire substrate. Thereafter, these trenches are filled with one or more conductive materials and one or more chemical mechanical polishing (CMP) processes are performed to remove excessive conductive materials outside of the trenches.

FIG. 1B is a simplistic plan view of the illustrative transistor device 11 just showing the device level contacts—the CA contacts 14 and the CB contact 16—and their relative locations for the device 11. Also depicted in FIG. 1B is the gate cap layer 24, a sidewall spacer 26 and the trench silicide structures 36 formed above the source/drain regions 20. As noted above, the entire CB gate contact 16 is positioned vertically above the isolation region 13 that surrounds the product 10, i.e., the CB gate contact 16 is not positioned above the active region defined in the substrate 12. The CB gate contact 16 is typically positioned above the isolation region 13 so as to avoid or reduce the chances of creating an electrical short between the CB contact 16 and the TS structure 36, i.e., there is a minimum spacing 43 that must be maintained between these two structures according to various design rules in an attempt to prevent such electrical shorts. Unfortunately, there is an area penalty associated with the requirement that the CB contact 16 only be positioned above the isolation region 13. What is needed is a method for forming the CB gate contact 16 above the active region of the device so as to conserve valuable plot space on an integrated circuit product.

The present disclosure is directed to various methods of forming a gate contact for a transistor above the active region and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact for a transistor above the active region and the resulting device. One illustrative method disclosed includes, among other things, forming a transistor above an active region defined in a semiconducting substrate. The transistor includes a gate structure, a first gate cap layer positioned above the gate structure and a first sidewall spacer positioned adjacent sidewalls of the gate structure. Source/drain (SD) contacts are formed adjacent the first sidewall spacer on each side of the gate structure. The first gate cap layer and a portion of the first sidewall spacer are removed so as to thereby define a gate contact cavity that exposes a portion of the gate structure and an upper portion of the SD contacts. The entire gate contact cavity is positioned vertically above a portion of the active region. A second spacer is formed in the gate contact cavity. A conductive gate plug is formed in the gate contact cavity. Upper portions of the SD contacts positioned adjacent the second spacer are removed to define a gate cap cavity. A second gate cap layer is formed in the gate cap cavity. A layer of insulating material is formed above the second gate cap layer. A first conductive structure is formed in the layer of insulating material conductively coupled to the gate structure.

Another method includes, among other things, forming a transistor above an active region defined in a semiconducting substrate. The transistor includes a gate structure, a first gate cap layer positioned above the gate structure and a first sidewall spacer positioned adjacent sidewalls of the gate structure. Source/drain (SD) contacts are formed adjacent the first sidewall spacer on each side of the gate structure. A first mask layer is formed above the source/drain (SD) contacts and the gate structure. The first mask layer has a first opening defined therein above the gate structure. The first gate cap layer and a portion of the first sidewall spacer are removed through the first opening in the first mask layer so as to thereby define a gate contact cavity that exposes a portion of the gate structure and an upper portion of the SD contacts, wherein the entire gate contact cavity is positioned vertically above a portion of the active region. A second spacer is formed in the gate contact cavity. A conductive gate plug is formed in the gate contact cavity. Upper portions of the SD contacts positioned adjacent the second spacer are removed to define a gate cap cavity. A second gate cap layer is formed in the gate cap cavity. A first layer of insulating material is formed above the second gate cap layer. First and second trenches are formed in the first layer of insulating material. A first cavity is formed in a bottom of the first trench above the gate structure and a second cavity is formed in a bottom of the second trench above one of the SD contacts. A first conductive structure is formed in the first trench and the first cavity conductively coupled to the gate structure. A second conductive structure is formed in the second trench and the second cavity conductively coupled to the one of the SD contacts.

BRIEF DESCRIPTION OF THE DRAWINGS

The disclosure may be understood by reference to the following description taken in conjunction with the accompanying drawings, in which like reference numerals identify like elements, and in which:

FIGS. 2A-3B2 depict various novel methods disclosed herein for forming a gate contact for a transistor above an active region and the resulting device.

Figure 1A:
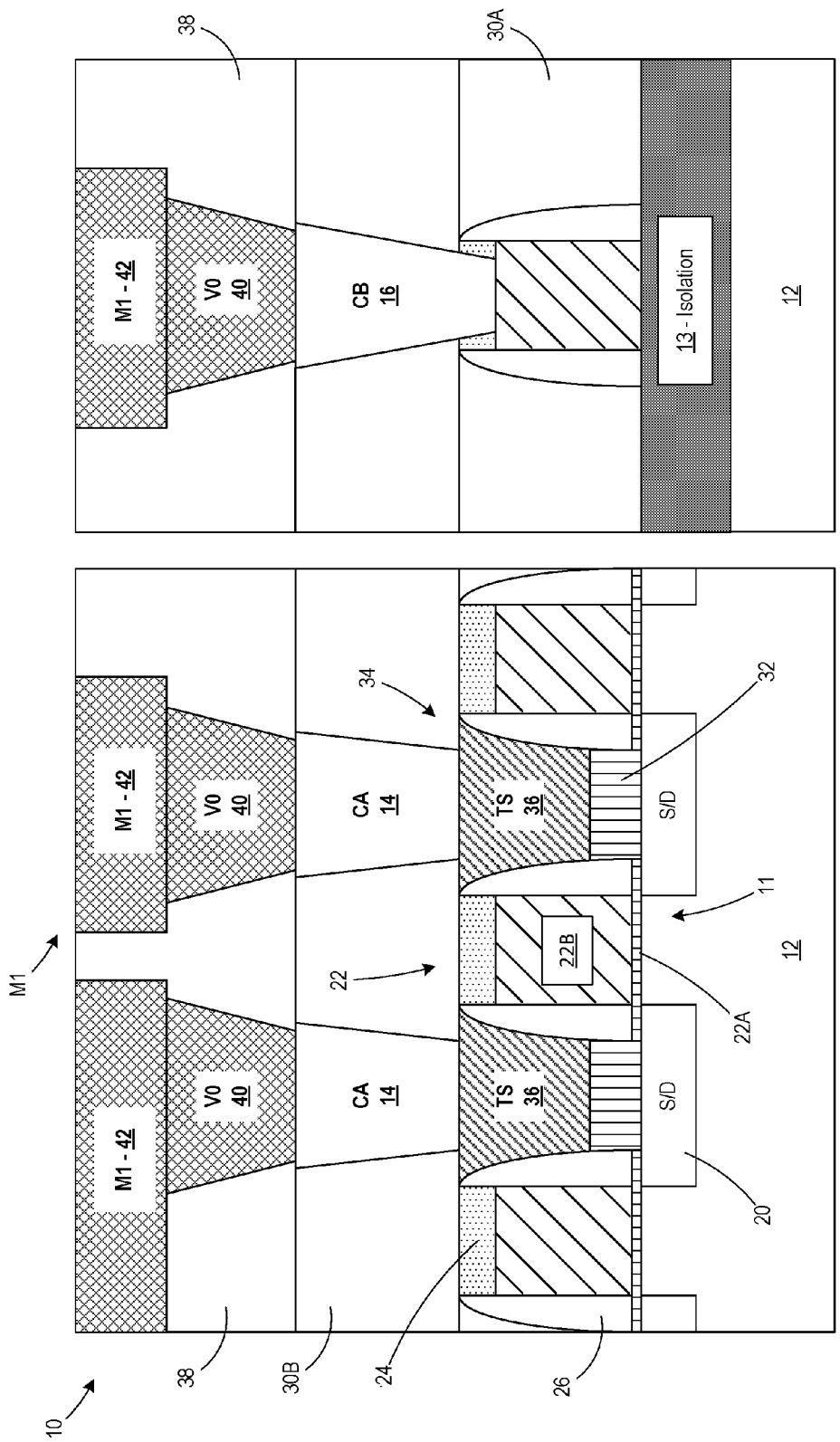
FIGS. 1A-1B depict various illustrative prior art arrangements of device-level contacts and metallization layers for an integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a conductive gate contact structure (CB) for a transistor above an active region and the resulting device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-3B2 depict various novel methods disclosed herein for forming a conductive gate contact structure (CB) for a transistor above the active region of a transistor formed on an integrated circuit (IC) product 100. The figures contain a simplistic plan view showing where various cross-sectional views are taken in the drawings. The plan view depicts gates, M1 lines, and the locations where an illustrative conductive gate contact structure (CB) and an illustrative conductive source/drain contact structure (CA) will eventually be formed above the substrate 102. As indicated in FIG. 2A, the views X1-X1 and X2-X2 are cross-sectional views taken through the device in a direction corresponding to the gate length direction of the device, while the views Y1-Y1 and Y2-Y2 are cross-sectional views taken through the device in a direction corresponding to the gate length direction of the device. The views X1-X1, Y1-Y1 are taken through the CB contact structure, and the views X2-X2, Y2-Y2 are taken through the CA contact structure. Not all views are illustrated on each sheet of the figures. Of course, the device may comprise more than one conductive source/drain contact structure (CA), but only one is depicted so as to simplify the drawings. It should also be noted that, although some of the figures contain a plan view of the product 100, not all aspects of the processing shown in the cross-sectional views will be depicted in the plan view so as to not overly complicate the drawings.

With continuing reference to FIG. 2A, the illustrative product 100 will be formed in and above the semiconductor substrate 102. In this example, the IC product 100 comprises four illustrative laterally spaced-apart gates 101 that were formed above the substrate 102. The product 100 may comprise either NMOS transistors, PMOS transistors or both types of transistors. The transistors may be of any desired configuration, e.g., FinFET devices, planar devices, etc. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein several process operations have been performed. First, an isolation region 103 was formed in the substrate 102 so as to define an active region (102X) where transistor devices will be formed. Next, a plurality of illustrative final gate structures 104, one for each of the gates 101, were formed above the substrate 102. Each of the gates 101 includes a schematically depicted final gate structure 104, gate cap layer 106 and an initial sidewall spacer 108. The sidewall spacer 108 was formed by performing a conformal deposition process to form a conformal layer of spacer material, e.g., silicon nitride, above the substrate 102 and thereafter performing an anisotropic etching process. The final gate structure 104 typically includes a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The sidewall spacer 108 and the gate cap layer 106 are typically formed of silicon nitride. The final gate structure 104 may be formed using well-known "gate first" or "replacement gate" manufacturing techniques. After the gate structures 104 were formed, an optional epitaxial semiconductor material 114 was formed in the source/drain regions of the transistor devices. The epitaxial semiconductor material 114 need not be formed in all embodiments. The physical size of the final gate structures 104 and the gate pitch for the final gate structures 104 may vary depending upon the particular application. Also depicted in FIG. 2A is a dielectric layer 110, e.g. silicon dioxide, that was deposited above the substrate 102 between the laterally spaced-apart gates 101. A planarization process (e.g., a chemical mechanical planarization (CMP) process) was performed on the dielectric layer 110 using the gate cap layers 106 as a polish-stop. This process operation exposes the upper surface of the gate cap layers 106. Other layers of material that may be present, such as a conformal contact etch stop layer that is formed above the epi material 114, are not depicted in the drawings so as to not overly complicate the drawings.

FIG. 2B depicts the product 100 after several process operations were performed. First, a patterned etch mask with an opening defined therein located above the active region 102X was formed above the substrate 102. The patterned etch mask 111 may take a variety of forms and may be comprised of a variety of different materials, e.g., a layer of photoresist, an anti-reflective coating layer and a planarizing layer. The patterned etch mask 111 may be formed using known photolithography tools and techniques. Next, one or more etching processes were performed through the patterned etch mask 111 to selectively remove the exposed portions of the dielectric layer 110 relative to the surrounding materials and expose the underlying source/drain regions. This process operation defines a plurality of source/drain contact cavities 120.

FIG. 2C depicts the product after several process operations were performed. First, the patterned etch mask 111 was removed. Then, a plurality of initial conductive source/drain metallization structures 122 were formed on the product 100 in the source/drain contact cavities 120. The initial conductive source/drain metallization structures 122, e.g., trench silicide containing regions, contact the raised epi source/drain regions 114 (the source/drain regions) and constitute the conductive source/drain metallization structures that will eventually be conductively coupled to the conductive source/drain contact structures (CA) that are to be subsequently formed on the product 100. Typically, a pre-clean process may be performed prior to forming metal silicide regions (not shown) that physically contact the raised epi material 114. Next, a simplistically depicted initial conductive source/drain metallization structure 122 was formed in each of the source/drain contact cavities 120 so as to establish contact to their respective source/drain region of the transistor devices. As noted above, the initial conductive source/drain metallization structures 122 (irrespective of their precise configuration and the manner in which they are made) provide an electrical path between the source/drain regions of the devices (including the raised epi source/drain regions 114) and the conductive source/drain contact structures (CA) that are to be subsequently formed for the product 100. The configuration and structure of the initial conductive source/drain metallization structures 122 may vary depending upon the particular application. In one example, the initial conductive source/drain metallization structures 122 are line-type structures that extend into and out of the drawing page in FIG. 2C that extend for substantially the entire length of the active region 102X (in a direction that corresponds to the gate width direction of the devices). In some cases, the initial conductive source/drain metallization structures 122 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the initial conductive source/drain metallization structures 122, a chemical mechanical polishing (CMP) process was performed to remove excess materials located above the upper surface of the gate cap layers 106.

With continuing reference to FIG. 2C, a hard mask layer 123 and a patterned CB masking layer 124, e.g., OPL, photoresist, etc., were formed above the product 100 after the planarization of the initial conductive source/drain metallization structures 122. The CB masking layer 124 has an opening 124A that exposes a portion of the gate 101A at a location above the active region where the conductive gate contact structure (CB) will be formed to contact the gate structure 104 of the gate 101A. Note that portions of the initial line-type conductive source/drain metallization structures 122 positioned on opposite sides of the gate 101A are exposed by the opening 124A.

FIG. 2D depicts the product 100 after one or more processes were performed. An ashing process was performed through the patterned CB masking layer 124 to pattern the hard mask layer 123. One or more etching processes were performed through the patterned hard mask layer 123 to selectively remove the exposed portions of the gate cap layer 106 and vertical portions of the initial sidewall spacer 108 for the gate 101A relative to the surrounding materials. This process operation exposes an upper surface 104S of the axial portion of the gate structure 104 positioned under the opening 124A in the patterned CB masking layer 124 and results in the definition of a gate contact cavity 126. The CB masking layer 124 was removed during the etching processes.

FIG. 2E depicts the product 100 after several process operations were performed. An inner spacer 128 was formed in the gate contact cavity 126 adjacent the conductive source/drain metallization structures 122 and above the recessed sidewall spacer 108. A conformal layer of spacer material (e.g., silicon nitride) was formed and an anisotropic etch process was performed to remove the horizontal portions of the conformal layer, resulting in the formation of the inner spacer 128. The inner spacer 128 may or may not be comprised of the same material as that of the spacer 108, and it may have the same lateral thickness of the spacer 108 or it may have a different lateral thickness. Thereafter, a conductive gate plug 130 (e.g., TiN) was formed in the remaining unfilled portions of the gate contact cavity 126 and inside the inner spacer 128. The conductive gate plug 130 may be of any desired cross-sectional configuration when viewed from above, e.g., square, rectangular, round, etc. The conductive gate plug 130 is intended to be schematic and representative in nature, as it may be formed using any of a variety of different conductive materials and by performing traditional manufacturing operations. The conductive gate plug 130 may also contain one or more barrier layers (not depicted). Thereafter, one or more CMP processes were performed to remove excess portions of the materials of the conductive gate plug 130, e.g., the liner and the tungsten (or cobalt), positioned above the gate cap layers 106 outside of the gate contact cavity 126 so as to thereby result in the formation of the conductive gate plug 130. Note that the conductive gate plug 130 is prevented from contacting the conductive source/drain metallization structures 122 laterally by the inner spacer 128. Also note that, in the depicted example, an outer perimeter of the conductive gate plug 130 is surrounded by the inner spacer 128. Lastly, in the example shown herein, the inner spacer 128 physically contacts both the conductive gate plug 130 and a portion of the initial conductive source/drain metallization structures 122, as clearly shown in the cross-sectional views.

FIG. 2F depicts the product 100 after a timed, recess etching process was performed to recess the conductive source/drain metallization structures 122 to define a gate cap recess 132. In some embodiments, the etching process may also be sufficient to remove the portions of the conductive gate plug 130 disposed above the conductive source/drain metallization structures 122 due to the relatively small thickness of the material in those regions. Alternatively, a short recess etch may be performed to remove the portions of the conductive gate plug 130 disposed above the conductive source/drain metallization structures 122 prior to recessing the conductive source/drain metallization structures 122.

Figure 2H:
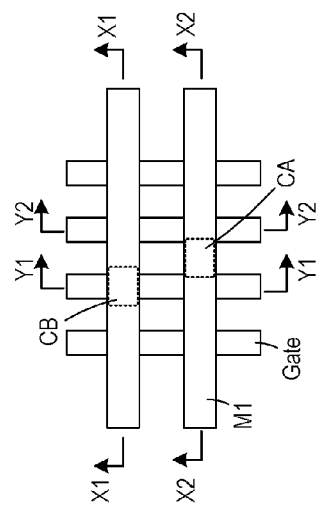
Figure 2H:
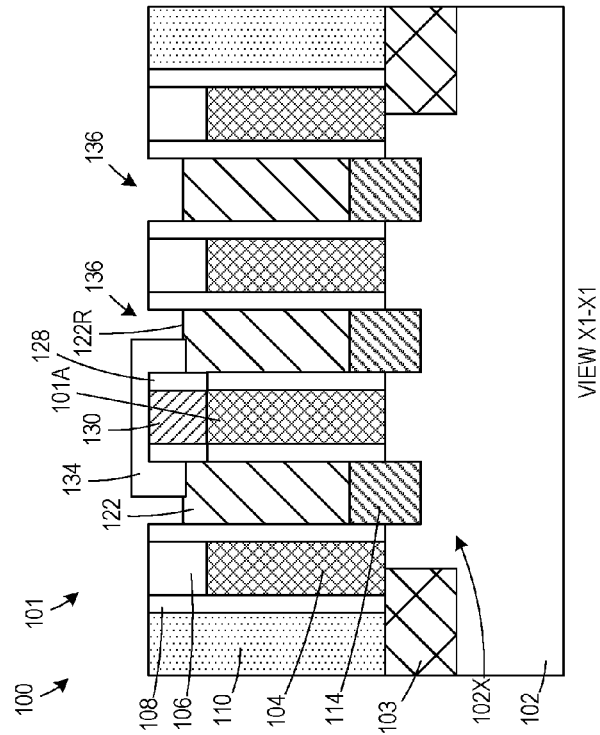
Figure 2G:
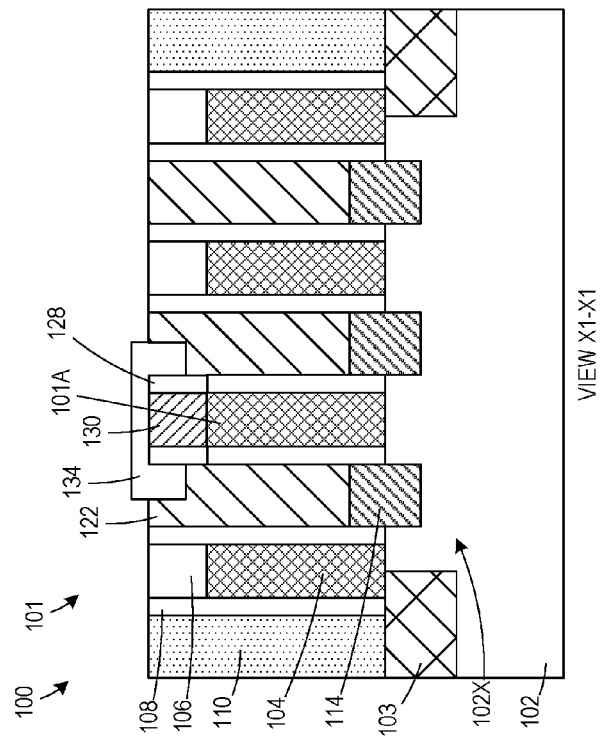

FIG. 2G depicts the product 100 after several process operations were performed. A replacement gate cap layer 134 was formed in the gate cap cavities 132 above the gate structure 104. The gate cap material for replacement gate cap layer 134 is deposited across the substrate 102 and in the gate cap cavities 132. After the material for the replacement gate cap layer 134 was deposited, one or more CMP processes were performed to remove excess portions of the materials of the replacement gate cap layer 134 (e.g., silicon nitride) positioned above the hard mask layer 123 outside of the cavities 132 so as to thereby result in the formation of the replacement gate cap layer 134. Then, a selective etch process was performed to remove the hard mask layer 123.

FIG. 2H depicts the product 100 after a timed, recess etching process was performed on the initial conductive source/drain metallization structures 122 so as to define a plurality of recessed conductive source/drain metallization structures 122 having a recessed upper surface 122R that is positioned at a level that is below a level of an upper surface of the conductive gate plug 130, e.g., by a distance of about 5-20 nm. This process operation results in the formation of a cavity 136 above each of the recessed conductive source/drain metallization structures 122. Note that, even after this recess etching process is performed, the internal spacer 128 physically contacts both the conductive gate plug 130 and a portion of the recessed conductive source/drain metallization structures 122, as clearly shown in the X1-X1 cross-sectional view.

Figure 2I:
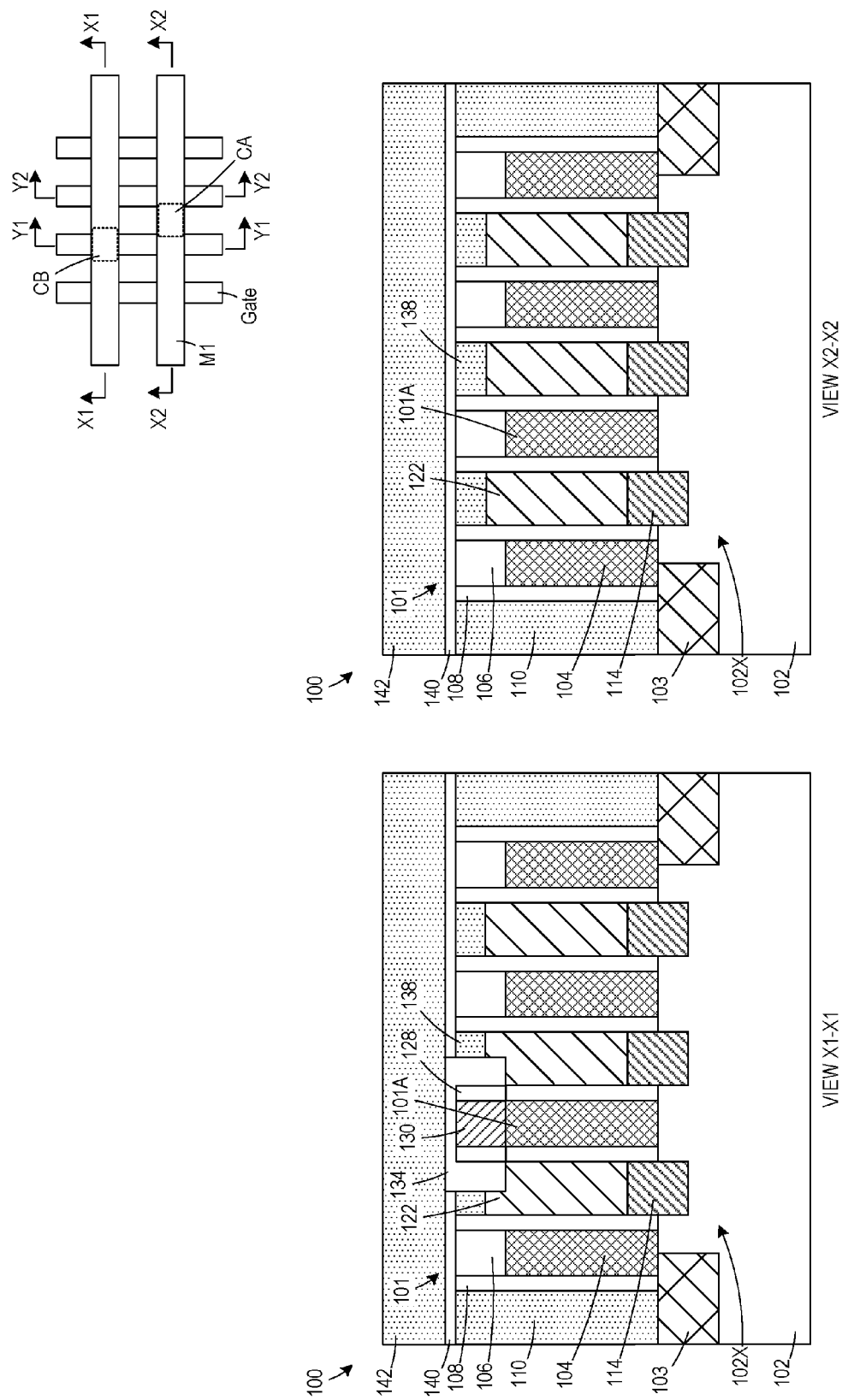

FIG. 2I depicts the product 100 after several process operations were performed. FIG. 2I shows both view "X1-X1" in the CB region and view "X2-X2" outside the CB region. First, a layer of insulating material 138, e.g. silicon dioxide, was deposited above the substrate 102 so as to over-fill the cavities 136. Thereafter, one or more CMP processes were performed using the replacement gate cap layer 134 as a polish-stop. This process removes excess portions of the layer of insulating material 138 positioned outside of the cavities 136. An etch stop layer 140 (e.g., silicon nitride) was formed above the layer of insulating material 138, and another layer of insulating material 142 was formed above the etch stop layer 140. In some applications, the layers of insulating material 138, 142 may be comprised of the same material as that of the dielectric layer 110, but that may not be the case in all applications.

Figure 1B:
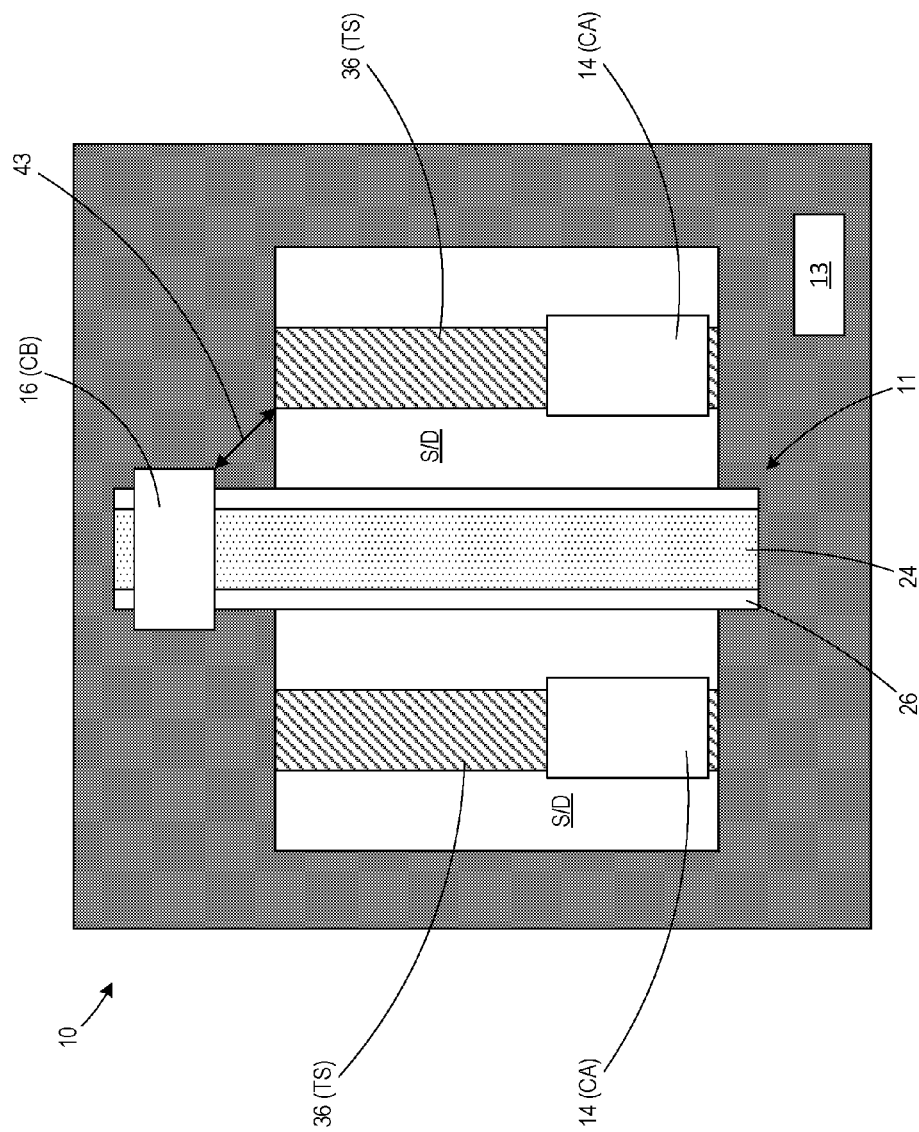

FIGS. 2J1 (X views) and 2J2 (Y views) illustrate the product 100 after a patterned M0 masking layer 144 (e.g., OPL, photoresist, BARC, etc.) was formed above the layer of insulating material 142. The M0 masking layer 144 has openings 144A, 144B that expose a portion of the layer of insulating material 142 at locations perpendicular to the gate structures 101. The opening 144A is aligned with the conductive gate plug 130 formed in the gate structure 101A. The M0 masking layer 144 is illustrated in phantom in FIG. 2J1 since the cross-section views are taken along the openings 144A, 144B.

FIGS. 2K1 (X views) and 2K2 (Y views) illustrate the product 100 after a plurality of processes was performed. An etching process was performed using the M0 masking layer 144 (e.g., OPL, photoresist, BARC, etc.) to define openings 142A, 142B in the layer of insulating material 142. The layer of insulating material 142 is illustrated in phantom in FIG. 2K1 since the cross-section view is taken along the opening 142A. A selective etch process may be used to etch the material of the layer of insulating material 142 selective to the etch stop layer 140. An ashing process was performed to remove the M0 masking layer 144.

FIGS. 2L1 (X views) and 2L2 (Y views) illustrate the product 100 after a patterned CA/CB masking layer 148 (e.g., OPL, photoresist, BARC, etc.) was formed above the layer of insulating material 142. The CA/CB masking layer 148 has a CB opening 148A formed in alignment with the conductive gate plug 130 formed in the gate structure 101A and a CA opening 148B formed in alignment with a particular conductive source/drain metallization structure 122A. Note that a portion of the replacement gate cap layer 134 for the gate 101A is exposed by the CB opening 148A.

FIGS. 2M1 (X views) and 2M2 (Y views) illustrate the product 100 after a selective etch process was performed (e.g., selective to SiN) to remove portions of the etch stop layer 140 exposed by the openings 148A, 148B to expose the conductive gate plug 130 and the portion of the layer of insulating material 110 above the conductive source/drain metallization structure 122A. Note that the etch process also removes portions of the replacement gate cap layer 134 exposed by the CB opening 148A, albeit the degree of gouging is exaggerated. Since the thickness of the etch stop layer 140 is known, the etch process may be a timed etch in some embodiments. The increased thickness of the replacement gate cap layer 134 provides a buffer against breakthrough to the conductive source/drain metallization structures 122 adjacent the conductive gate plug 130.

FIGS. 2N1 (X views) and 2N2 (Y views) illustrate the product 100 after a selective etch process was performed (e.g., selective to oxide) to remove portions of the layer of insulating material 138 exposed by the opening 148B to deepen the opening 142B to expose the conductive gate plug 130 and to remove the portion of the layer of insulating material 138 above the conductive source/drain metallization structure 122A to define a CA opening 110CA. An ashing process was performed to remove the CA/CB masking layer 148. Note that the etch process also removes portions of the replacement gate cap layer 134 exposed by the CB opening 148A, albeit the degree of gouging is exaggerated. Since the thickness of the etch stop layer 140 is known, the etch process may be a timed etch in some embodiments. The increased thickness of the replacement gate cap layer 134 provides a buffer against breakthrough to the conductive source/drain metallization structures 122 adjacent the conductive gate plug 130.

FIGS. 2O1 (X views) and 2O2 (Y views) illustrate the product 100 after an ashing process was performed to remove the CA/CB masking layer 148.

FIGS. 2P1 (X views) and 2P2 (Y views) illustrate the product 100 after a plurality of processes was performed to form conductive lines 150A, 150B in the trenches 142A, 142B. A conductive CB via 152 extends from the conductive line 150A to contact the conductive gate plug 130, and a conductive CA via 154 extends from the conductive line 150B to contact the conductive source/drain metallization structures 122A. The conductive lines 150A, 150B and vias 152, 154 are intended to be schematic and representative in nature, as they may be formed using any of a variety of different conductive materials and by performing traditional manufacturing operations. The conductive lines 150A, 150B and vias 152, 154 may also contain one or more barrier layers (not depicted). In one illustrative example, the conductive lines 150A, 150B and vias 152, 154 may be formed by depositing a conformal liner (e.g., Ti, TiN) followed by overfilling the cavities with a conductive fill material, such as tungsten, cobalt or copper. Thereafter, one or more CMP processes may be performed to remove excess portions of the materials of the conductive lines 150A, 150B positioned outside of the cavities.

FIGS. 3A1 (X views) and 3A2 (Y views) illustrate the product 100 after an optional selective etch process was performed at the point in the process flow illustrated in FIGS. 2N1 and 2N2 to remove the conductive gate plug 130.

FIGS. 3B1 (X views) and 3B2 (Y views) illustrate the product 100 after the remaining processes illustrated in FIGS. 2O-2P were performed to form the conductive lines 150A, 150B and vias 152, 154. The removal of the conductive gate plug 130 allows a lower resistivity material to be used for the vias 152, 154.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a transistor above an active region defined in a semiconducting substrate, said transistor comprising a gate structure, a first gate cap layer positioned above said gate structure and a first sidewall spacer positioned adjacent sidewalls of said gate structure;
   forming source/drain (SD) contacts adjacent said first sidewall spacer on each side of said gate structure;
   removing said first gate cap layer and a portion of said first sidewall spacer so as to thereby define a gate contact cavity that exposes a portion of said gate structure and an upper portion of said SD contacts, wherein an entirety of said gate contact cavity is positioned vertically above a portion of said active region;
   forming a second spacer in said gate contact cavity;
   forming a conductive gate plug in said gate contact cavity;
   removing upper portions of said SD contacts positioned adjacent said second spacer to define a gate cap cavity;
   forming a second gate cap layer in said gate cap cavity;
   forming a first layer of insulating material above said second gate cap layer; and
   forming a first conductive structure in said first layer of insulating material conductively coupled to said gate structure.

2. The method of claim 1, wherein forming said first conductive structure comprises:
   removing a portion of said second gate cap layer to define a via cavity exposing said conductive gate plug; and
   forming a conductive material in said via cavity contacting said conductive gate plug.

3. The method of claim 1, wherein forming said first conductive structure comprises:
   removing a portion of said second gate cap layer to define a via cavity exposing said conductive gate plug;
   removing said conductive gate plug to expose said gate structure; and
   forming a conductive material in said via cavity contacting said gate structure.

4. The method of claim 1, wherein forming said first conductive structure comprises:
   forming a first trench in said first layer of insulating material, wherein said second gate cap layer is exposed by said first trench;
   removing a portion of said second gate cap layer to define a via cavity; and
   forming said first conductive structure in said first trench and said via cavity.

5. The method of claim 4, further comprising:
   forming a mask layer in said first trench, said mask layer having a first opening exposing at least a portion of said second gate cap layer; and
   removing said portion of said second gate cap layer by performing an etch process through said first opening.

6. The method of claim 4, further comprising recessing said SD contacts.

7. The method of claim 6, further comprising:
   forming a second layer of insulating material above said recessed SD contacts, wherein said first layer of insulating material is formed above said second layer of insulating material;
   forming a second trench in said first layer of insulating material, wherein a portion of said second layer of insulating material disposed above at least a first one of said recessed SD contacts is exposed by said second trench;

removing said exposed portion of said second layer of insulating material to expose said first one of said recessed SD contacts and to define an SD via cavity; and forming a second conductive structure in said second trench and said SD via cavity.

8. The method of claim 7, further comprising:
forming a mask layer in said first and second trenches, said mask layer having a first opening exposing at least a portion of said second gate cap layer and a second opening exposing said portion of said second layer of insulating material; and
removing said portion of said second gate cap layer and said portion of said second layer of insulating material by performing one or more etch processes through said first and second openings.

9. The method of claim 1, wherein removing said upper portions of said SD contacts comprises:
forming a mask layer above said SD contacts, said mask layer covering first portions of an upper surface of said SD contacts and having an opening exposing second portions of said upper surface adjacent said second spacer; and
etching said SD contacts through said opening to remove said upper portions of said SD contacts.

10. The method of claim 9, further comprising:
removing said mask layer to expose said first portions of said upper surface of said SD contacts;
performing an etch process to recess said SD contacts; and
forming a second layer of insulating material above said recessed SD contacts.

11. A method, comprising:
forming a transistor above an active region defined in a semiconducting substrate, said transistor comprising a gate structure, a first gate cap layer positioned above said gate structure and a first sidewall spacer positioned adjacent sidewalls of said gate structure;
forming source/drain (SD) contacts adjacent said first sidewall spacer on each side of said gate structure;
forming a first mask layer above said source/drain (SD) contacts and said gate structure, said first mask layer having a first opening defined therein above said gate structure;
removing said first gate cap layer and a portion of said first sidewall spacer through said first opening in said first mask layer so as to thereby define a gate contact cavity that exposes a portion of said gate structure and an upper portion of said SD contacts, wherein an entirety of said gate contact cavity is positioned vertically above a portion of said active region;
forming a second spacer in said gate contact cavity;
forming a conductive gate plug in said gate contact cavity;
removing upper portions of said SD contacts positioned adjacent said second spacer to define a gate cap cavity;
forming a second gate cap layer in said gate cap cavity;
forming a first layer of insulating material above said second gate cap layer;
forming first and second trenches in said first layer of insulating material;
forming a first cavity in a bottom of said first trench above said gate structure and a second cavity in a bottom of said second trench above one of said SD contacts;

forming a first conductive structure in said first trench and said first cavity conductively coupled to said gate structure; and
forming a second conductive structure in said second trench and said second cavity conductively coupled to said one of said SD contacts.

12. The method of claim 11, wherein forming said first conductive structure comprises:
removing a portion of said second gate cap layer exposed by said first cavity to define a via cavity exposing said conductive gate plug; and
forming said first conductive structure in said via cavity contacting said conductive gate plug.

13. The method of claim 11, wherein forming said first conductive structure comprises:
removing a portion of said second gate cap layer exposed by said first cavity to define a via cavity exposing said conductive gate plug;
removing said conductive gate plug to expose said gate structure; and
forming said first conductive structure in said via cavity contacting said gate structure.

14. The method of claim 11, further comprising:
recessing said SD contacts; and
forming a second layer of insulating material above said recessed SD contacts, wherein said first layer of insulating material is formed above said second layer of insulating material.

15. The method of claim 14, further comprising:
forming a second mask layer in said first and second trenches, said second mask layer having a second opening exposing at least a portion of said second gate cap layer and a third opening exposing at least a portion of said second layer of insulating material;
removing said portion of said second gate cap layer by performing an etch process through said first opening; and
removing said portion of said second layer of insulating material by performing an etch process through said second opening.

16. The method of claim 15, wherein a portion of said second layer of insulating material disposed above said one of said SD contacts is exposed by said second trench, and the method further comprises:
removing said exposed portion of said second layer of insulating material to expose said one of said SD contacts and to define an SD via cavity; and
forming said second conductive structure in said second trench and in said SD via cavity.

17. The method of claim 11, wherein removing said upper portions of said SD contacts comprises etching said SD contacts through said first opening in said first mask layer.

18. The method of claim 17, further comprising:
removing said first mask layer to expose said first portions of said upper surface of said SD contacts; and
performing an etch process to recess said SD contacts; and
forming a second layer of insulating material above said recessed SD contacts.

19. The method of claim 11, further comprising removing said first mask layer prior to forming said first layer of insulating material.

* * * * *